United States Patent
Seo et al.

(10) Patent No.: US 12,261,198 B2
(45) Date of Patent: *Mar. 25, 2025

(54) SEMICONDUCTOR DEVICE AND METHOD FOR FABRICATING THE SAME

(71) Applicant: SK hynix Inc., Gyeonggi-do (KR)

(72) Inventors: Jun Hyuk Seo, Gyeonggi-do (KR); Myoung Sik Chang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/406,385

(22) Filed: Jan. 8, 2024

(65) Prior Publication Data

US 2024/0145527 A1    May 2, 2024

Related U.S. Application Data

(63) Continuation of application No. 17/898,574, filed on Aug. 30, 2022, now Pat. No. 11,901,403, which is a
(Continued)

(30) Foreign Application Priority Data

Jun. 29, 2020   (KR) .................. 10-2020-0079280

(51) Int. Cl.
*H01L 21/00* (2006.01)
*G06F 11/34* (2006.01)
(Continued)

(52) U.S. Cl.
CPC .......... *H01L 28/75* (2013.01); *G06F 11/3409* (2013.01); *G06N 20/00* (2019.01);
(Continued)

(58) Field of Classification Search
CPC ............... H01L 28/75; H01L 21/02175; H01L 21/0223; H01L 21/02244; H01L 21/32134;
(Continued)

(56) References Cited

U.S. PATENT DOCUMENTS 11,901,403 B2 * 2/2024 Seo .................. H01L 28/75
2013/0005110 A1   1/2013 Yoon et al.
(Continued)

FOREIGN PATENT DOCUMENTS

CN       1790675 A    6/2006
CN     103840002 A    6/2014
(Continued)

OTHER PUBLICATIONS

Office Action for the Korean Patent Application No. 10-2020-0079280 issued by the Korean Intellectual Property Office on Mar. 19, 2024.
(Continued)

*Primary Examiner* — Richard A Booth
(74) *Attorney, Agent, or Firm* — IP & T GROUP LLP

(57) ABSTRACT

A method for fabricating a semiconductor device includes: forming a mold structure including a mold layer and a supporter layer over a semiconductor substrate; forming an opening penetrating the mold structure; forming a protective layer on a bottom surface and a sidewall of the opening; forming a lower electrode over the protective layer; selectively etching the supporter layer to form a supporter that supports the lower electrode; removing the mold layer to define a non-exposed portion and an exposed portion of an outer wall of the protective layer; and selectively trimming the exposed portion of the protective layer to form a protective layer pattern between the supporter and the lower electrode.

9 Claims, 21 Drawing Sheets

Related U.S. Application Data continuation of application No. 17/158,729, filed on Jan. 26, 2021, now Pat. No. 11,456,352.

(51) Int. Cl.
  *G06N 20/00*  (2019.01)
  *G06V 10/774*  (2022.01)
  *G06V 10/778*  (2022.01)
  *H01L 49/02*  (2006.01)
  *H01L 21/02*  (2006.01)
  *H01L 21/3213*  (2006.01)
  *H10B 12/00*  (2023.01)

(52) U.S. Cl.
  CPC .......... *G06V 10/774* (2022.01); *G06V 10/778* (2022.01); *H01L 21/02175* (2013.01); *H01L 21/0223* (2013.01); *H01L 21/02244* (2013.01); *H01L 21/32134* (2013.01); *H10B 12/315* (2023.02)

(58) Field of Classification Search
  CPC .... G06N 20/00; G06V 10/778; G06V 10/774; G06F 11/3409; H10B 12/315
  See application file for complete search history.

(56) References Cited

U.S. PATENT DOCUMENTS

| | | |
|---|---|---|
| 2013/0147048 A1 | 6/2013 | Kuh et al. |
| 2014/0065784 A1 | 3/2014 | Yoon et al. |
| 2019/0333985 A1 | 10/2019 | Lee et al. |
| 2019/0355806 A1* | 11/2019 | Kang ................ H01L 21/28556 |
| 2020/0091275 A1* | 3/2020 | Kim ..................... H10B 12/033 |
| 2020/0365537 A1* | 11/2020 | Choi .................... H10B 12/053 |
| 2021/0066066 A1* | 3/2021 | Lee ................... H01L 21/76885 |
| 2022/0123103 A1* | 4/2022 | Jung ...................... H01L 28/60 |

FOREIGN PATENT DOCUMENTS

| | | |
|---|---|---|
| KR | 20100104685 A | 9/2010 |
| KR | 20190009563 A | 1/2019 |
| KR | 20200046166 A | 5/2020 |

OTHER PUBLICATIONS

Office Action for the Chinese Patent Application No. 202110359702.9 issued by the Chinese Patent Office on Dec. 26, 2024.

* cited by examiner

SEMICONDUCTOR DEVICE AND METHOD FOR FABRICATING THE SAME

CROSS-REFERENCE TO RELATED APPLICATIONS

The present application is a continuation of U.S. patent application Ser. No. 17/898,574 filed on Aug. 30, 2022. The '574 application is a continuation of U.S. patent application Ser. No. 17/158,729 filed on Jan. 26, 2021 and issued as U.S. Pat. No. 11,456,352 on Sep. 27, 2022, which claims priority to Korean Patent Application No. 10-2020-0079280, filed on Jun. 29, 2020. The entire disclosure of each of the foregoing applications is incorporated herein by reference in its entirety.

BACKGROUND

1. Field

Various embodiments of the present invention relate to a semiconductor device and, more particularly, to a semiconductor device including a capacitor, and a method for fabricating the semiconductor device.

2. Description of the Related Art

Since semiconductor memories are highly integrated, the unit cell area decreases which leads to a reduction in operating voltage. This requires high-k materials having a high capacitance and a low leakage current.

SUMMARY

Embodiments of the present invention are directed to a semiconductor device including a capacitor having a high dielectric constant and a low leakage current, and a method for fabricating the semiconductor device.

In accordance with an embodiment of the present invention, a method for fabricating a semiconductor device includes: forming a mold structure including a mold layer and a supporter layer over a semiconductor substrate; forming an opening penetrating the mold structure; forming a protective layer on a bottom surface and a sidewall of the opening; forming a lower electrode over the protective layer; selectively etching the supporter layer to form a supporter that supports the lower electrode; removing the mold layer to expose a portion of an outer wall of the protective layer; and selectively trimming the exposed portion of the protective layer to form a protective layer pattern between the supporter and the lower electrode.

In accordance with another embodiment of the present invention, a semiconductor device includes: a lower electrode over a semiconductor substrate; a supporter supporting an outer wall of the lower electrode; an amorphous protective layer pattern between the supporter and the lower electrode; and a lower-level amorphous protective layer pattern positioned between the lower electrode and the semiconductor substrate and vertically spaced apart from the amorphous protective layer pattern.

These and other features and advantages of the present invention will become apparent to the person with ordinary skill in the art from the following detailed description and figures.

DETAILED DESCRIPTION

Figure 1A:
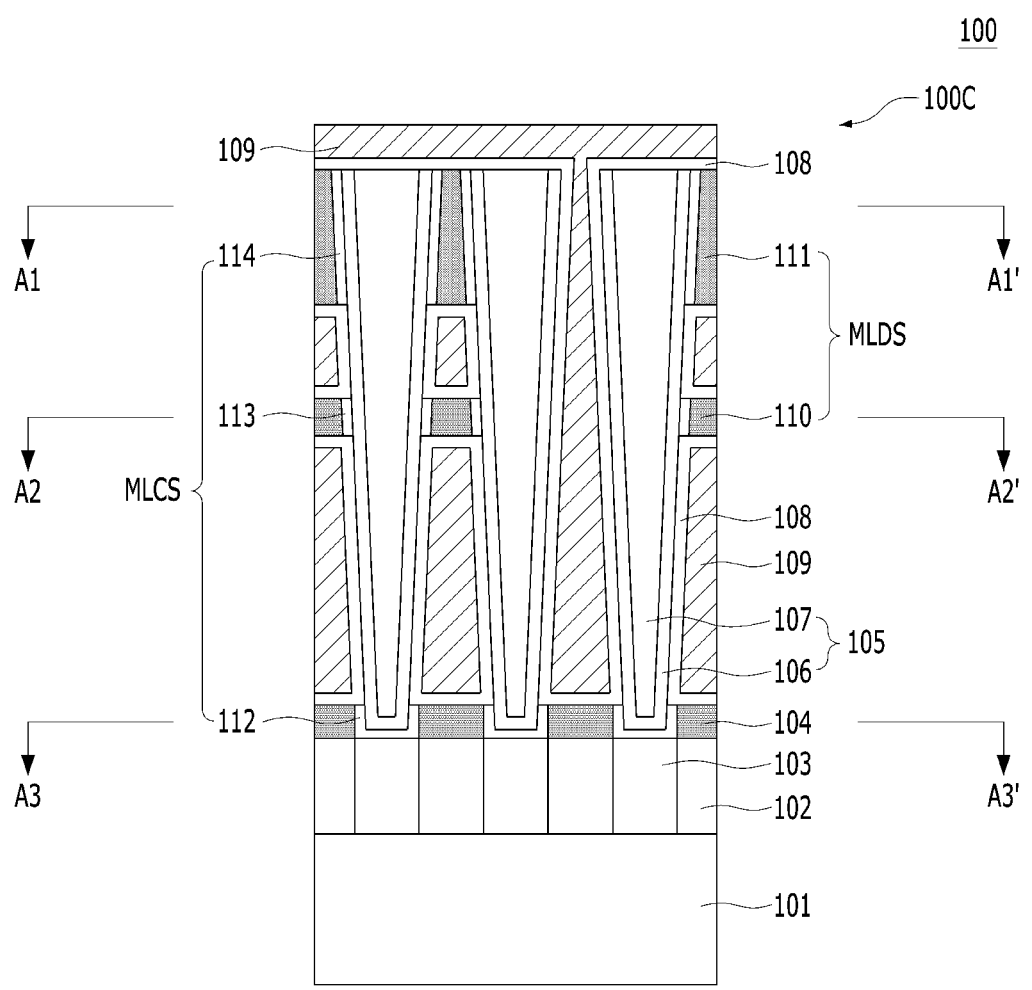
FIG. 1A is a cross-sectional view illustrating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art to which the present invention pertains. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

It should be understood that the drawings are simplified schematic illustrations of the described devices and may not include well known details for avoiding obscuring the features of the invention.

It should also be noted that features present in one embodiment may be used with one or more features of another embodiment without departing from the scope of the invention.

Figure 1B:
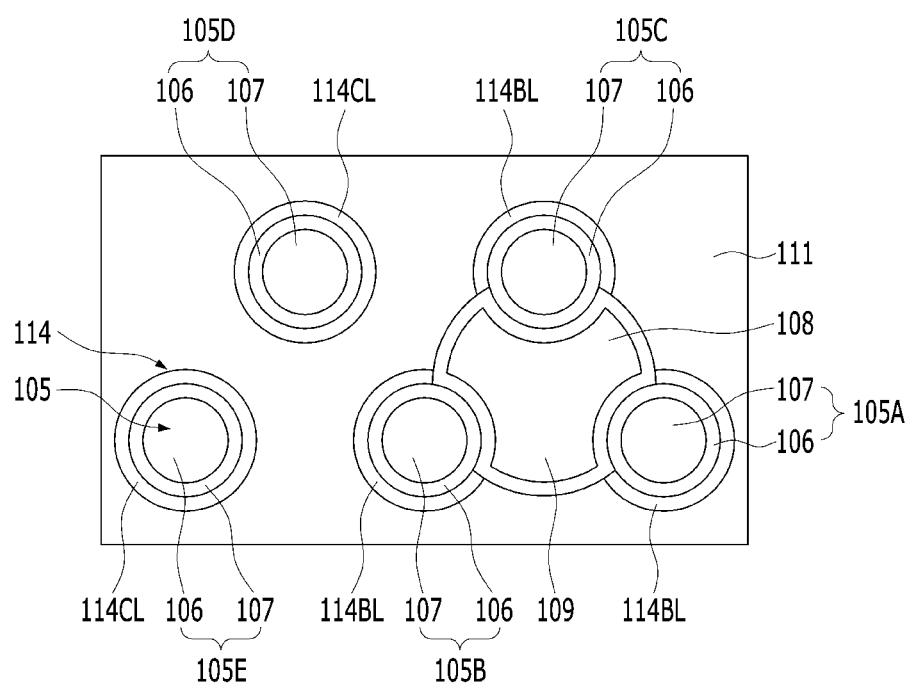
FIG. 1B is a plan view taken along a line A1-A1' of FIG. 1A.
Figure 1C:
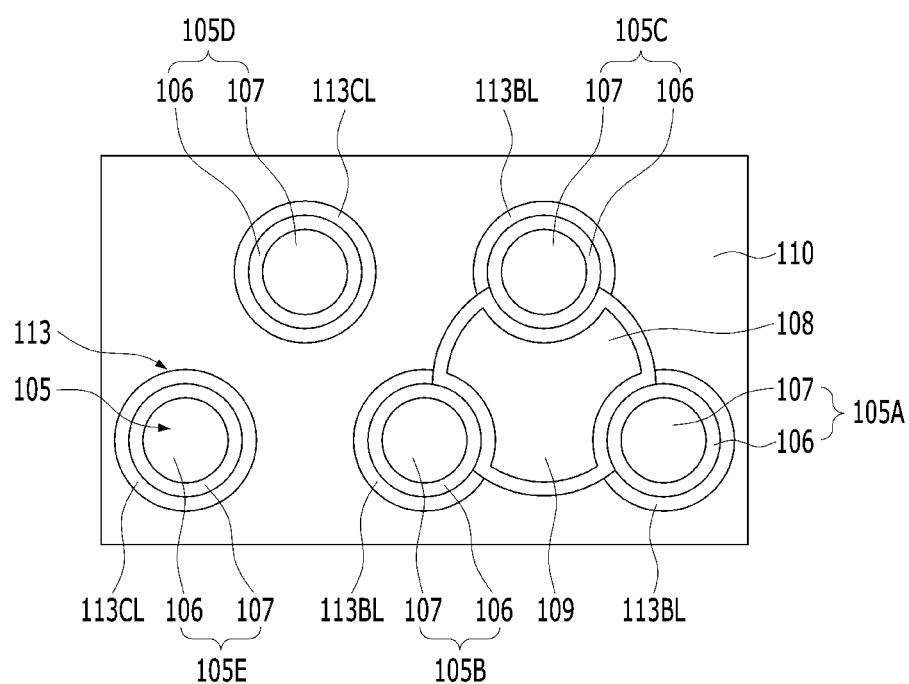
FIG. 1C is a plan view taken along a line A2-A2' of FIG. 1A.
Figure 1D:
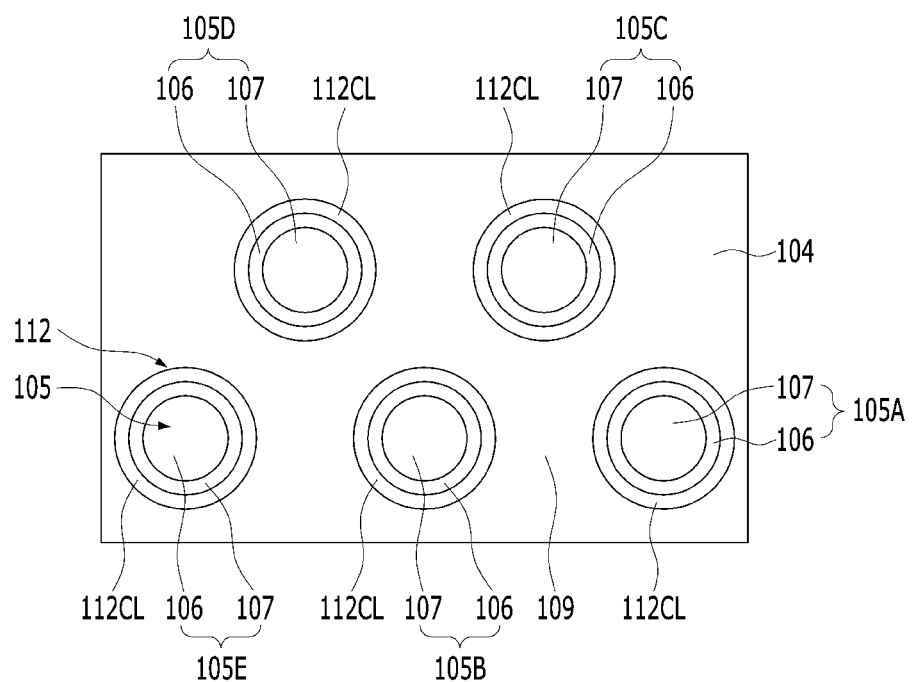
FIG. 1D is a plan view taken along a line A3-A3' of FIG. 1A.

FIG. 1A is a cross-sectional view illustrating a semiconductor device 100 in accordance with an embodiment of the present invention. FIG. 1B is a plan view taken along a line A1-A1' of FIG. 1A. FIG. 1C is a plan view taken along a line A2-A2' of FIG. 1A. FIG. 1D is a plan view taken along a line A3-A3' of FIG. 1A.

Referring to FIGS. 1A to 1D, the semiconductor device 100 may include a lower structure 101 and a capacitor structure 100C disposed over the lower structure 101. The capacitor structure 100C may be electrically connected to the lower structure 101 through a plurality of contact plugs 103. The contact plugs 103 may penetrate an inter-layer dielectric layer 102 over the lower structure 101 to be coupled to the lower structure 101. The contact plugs 103 may be referred to as storage node contact plugs.

Although not illustrated, the lower structure 101 may include a semiconductor substrate, a buried word line formed in the semiconductor substrate, and a bit line over the buried word line.

The lower structure 101 may include a material appropriate for semiconductor processing. For example, the lower structure 101 may include a semiconductor substrate, and the semiconductor substrate may be formed of a silicon-containing material. The semiconductor substrate may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The semiconductor substrate may include other semiconductor materials such as germanium. The semiconductor substrate may include a group-III/V semiconductor substrate, such as a compound semiconductor substrate such as GaAs. The semiconductor substrate may include a Silicon-On-Insulator (SOI) substrate.

The capacitor structure 100C may include an etch stop layer 104, lower electrodes 105, a dielectric layer 108, and upper electrodes 109. The bottom portion of each of the lower electrodes 105 may penetrate the etch stop layer 104 to be coupled to a corresponding contact plug 103. The lower electrode 105 may be of a hybrid type, and it may include a cylinder electrode 106 and a pillar electrode 107 filling the cylindrical inside of the cylinder electrode 106. The lower electrode 105 may be referred to as a storage node. The lower electrode 105 may be positioned over the semiconductor substrate of the lower structure 101. The contact plugs 103 may be positioned between the semiconductor substrate and corresponding lower electrodes 105.

The outer wall of the lower electrodes 105 may be supported by a supporter MLDS. The supporter MLDS may include a plate-like structure which laterally extends to simultaneously support a plurality of neighboring lower electrodes 105. The supporter MLDS may include at least one supporter. For example, the supporter MLDS may include a multi-level dielectric supporter. The supporter MLDS may include an upper-level supporter 111 and a lower-level supporter 110. The upper-level supporter 111 may support the upper outer wall of the lower electrodes 105, and the lower-level supporter 110 may be vertically spaced apart from the upper-level supporter 111 to support the outer wall of the lower electrodes 105. The upper-level supporter 111 may be thicker than the lower-level supporter 110. The distance between the upper-level supporter 111 and the lower-level supporter 110 may be smaller than the distance between the lower-level supporter 111 and the etch stop layer 104. From the perspective of a top view, each of the upper-level supporter 111 and the lower-level supporter 110 may have a plate-like structure. The upper-level supporter 111 and the lower-level supporter 110 may be formed of the same material or different materials. The upper-level supporter 111 and the lower-level supporter 110 may include silicon, nitrogen, oxygen, carbon, or a combination thereof. The upper level supporter 111 and the lower level supporter 110 may be made of the same material or different materials. For example, the upper level supporter 111 and the lower level supporter 110 may be formed of silicon nitride, silicon carbon nitride, or silicon boron nitride.

A protective structure MLCS may be positioned between the lower electrode 105 and the supporter MLDS. The protective structure MLCS may serve as a discrete supporter that independently supports each lower electrode 105. The laterally neighboring protective structures MLCS may be separated from each other. The protective structure MLCS may include at least one protective layer pattern. For example, the protective structure MLCS may include a multi-level protective layer pattern. The supporter MLDS and the protective structure MLCS may be formed of different materials. The supporter MLDS may include a dielectric material, and the protective structure MLCS may include a conductive material.

The protective structure MLCS may include an upper-level protective layer pattern 114, a middle-level protective layer pattern 113, and a lower-level protective layer pattern 112. The upper-level protective layer pattern 114 may be positioned between the lower electrode 105 and the upper-level supporter 111 to support the upper outer wall of the lower electrode 105. The upper-level protective layer pattern 114 and the upper-level supporter 111 may be positioned at the same level. The middle-level protective layer pattern 113 may be positioned between the lower electrode 105 and the lower-level supporter 110, and the middle-level protective layer pattern 113 may be spaced apart from the upper-level protective layer pattern 114 to support the outer wall of the lower electrode 105. The middle-level protective layer pattern 113 and the lower-level supporter 110 may be positioned at the same level. The lower-level protective layer pattern 112 may be vertically spaced apart from the middle-level protective layer pattern 113 to surround and support the bottom surface and the bottom sidewall of the lower electrode 105. The height of the upper-level protective layer pattern 114 may be greater than the height of the middle-level protective layer pattern 113. The lower-level protective layer pattern 112 may be positioned between the lower structure 101 and the lower electrode 105. The lower-level protective layer pattern 112 may directly contact the etch stop layer 104 and the corresponding contact plug 103. The distance between the upper-level protective layer pattern 114 and the middle-level protective layer pattern 113 may be smaller than the distance between the middle-level protective layer pattern 113 and the lower-level protective layer pattern 112. From the perspective of a top view, the upper-level protective layer pattern 114, the middle-level protective layer pattern 113, and the lower-level protective layer pattern 112 may fully surround or partially surround a portion of the outer wall of the lower electrode 105. A plurality of the upper-level protective layer patterns 114 may be positioned at the same level, while being spaced apart from each other. A plurality of the middle-level protective layer patterns 113 may be positioned at the same level, while being spaced apart from each other. A plurality of the lower-level protective layer patterns 112 may be positioned at the same level, while being spaced apart from each other.

The upper-level protective layer pattern 114, the middle-level protective layer pattern 113, and the lower-level protective layer pattern 112 may include titanium nitride, niobium, or a combination thereof. The upper-level protective layer pattern 114, the middle-level protective layer pattern 113, and the lower-level protective layer pattern 112 may be made of the same material or different materials. For example, the upper-level protective layer pattern 114, the middle-level protective layer pattern 113, and the lower-level protective layer pattern 112 may be formed of niobium (Nb). Since the upper-level protective layer pattern 114, the middle-level protective layer pattern 113, and the lower-level protective layer pattern 112 include a conductive material, they may serve as a portion of the lower electrode 105.

According to some embodiments of the present invention, the cylindrical electrode 106 of the lower electrode 105 may include a crystalline conductive material, and the upper-level protective layer pattern 114, the middle-level protective layer pattern 113, and the lower-level protective layer pattern 112 may include an amorphous conductive material. For example, the cylindrical electrode 106 may include crystalline titanium nitride, and the upper-level protective layer pattern 114, the middle-level protective layer pattern 113, and the lower-level protective layer pattern 112 may include amorphous titanium nitride.

According to another embodiment of the present invention, the cylindrical electrode 106 may include crystalline titanium nitride, and the upper-level protective layer pattern 114, the middle-level protective layer pattern 113, and the lower-level protective layer pattern 112 may include amorphous niobium. According to another embodiment of the present invention, the cylindrical electrode 106 may include crystalline niobium, and the upper-level protective layer pattern 114, the middle-level protective layer pattern 113, and the lower-level protective layer pattern 112 may include amorphous niobium.

According to another embodiment of the present invention, the cylindrical electrode 106 may include crystalline niobium, and the upper-level protective layer pattern 114, the middle-level protective layer pattern 113, and the lower-level protective layer pattern 112 may include amorphous titanium nitride.

As will be described later, the amorphous conductive material as the protective structure MLCS may serve to suppress deterioration in the roughness of the cylindrical electrode 106 during a wet dip-out process of a mold layer which is to be formed subsequently.

As described above, since the lower electrodes 105 are supported by the hybrid supporters, that is, the upper-level supporter 111, the lower-level supporter 110, the upper-level protective layer pattern 114, the middle-level protective layer pattern 113, and the lower-level protective layer pattern 112, the structural stability of lower electrodes 105 may be increased.

Referring back to FIG. 1B, upper portions of the neighboring lower electrodes 105A, 105B, 105C, 105D, and 105E may be supported by the plate-shaped upper-level supporter 111 and the discrete upper-level protective layer patterns 114. The upper-level protective layer pattern 114 may include broken loop-shaped protective layer patterns 114BL and closed loop-shaped protective layer patterns 114CL. From the perspective of a top view, the closed loop-shaped protective layer patterns 114CL may have a continuous ring shape, and the broken loop-shaped protective layer patterns 114BL may have a discontinuous ring shape, for example, a 'C' shape. Some of the lower electrodes 105A, 105B, and 105C may be supported by the plate-shaped upper-level supporter 111 and the broken loop-shaped protective layer patterns 114BL. Some of the lower electrodes 105D and 105E may be supported by the plate-shaped upper-level supporter 111 and the closed loop-shaped protective layer patterns 114CL.

Referring back to FIG. 1C, the middle portions of the neighboring lower electrodes 105A, 105B, 105C, 105D and 105E may be supported by the plate-shaped lower-level supporter 110 and the middle-level protective layer patterns 113. The middle-level protective layer patterns 113 may include broken loop-shaped protective layer patterns 113BL and the closed loop-shaped protective layer patterns 113CL. From the perspective of a top view, the closed loop-shaped protective layer patterns 113CL may have a continuous ring shape, and the broken loop-shaped protective layer patterns 113BL may have a discontinuous ring shape, for example, a 'C' shape. The outer wall of some lower electrodes 105A, 105B and 105C may be supported by the plate-shaped lower-level supporter 110 and the broken loop-shaped protective layer patterns 113BL. Some lower electrodes 105D and 105E may be supported by the plate-shaped lower-level supporter 110 and the closed loop-shaped protective layer patterns 113CL.

Referring back to FIG. 1D, the bottom portions of the neighboring lower electrodes 105A, 105B, 105C, 105D and 105E may be supported by the plate-shaped etch stop layer 104 and the lower-level protective layer patterns 112. The lower-level protective layer patterns 112 may include closed loop-shaped protective layer patterns 112CL. From the perspective of a top view, the closed loop-shaped protective layer patterns 112CL may have a continuous ring shape. The bottom portions of the lower electrodes 105A, 105B, 105C, 105D and 105E may be supported by the closed loop-shaped protective layer patterns 112CL.

FIGS. 2A to 2I are cross-sectional views illustrating an example of a method for fabricating a semiconductor device in accordance with an embodiment of the present invention.

Figure 2A:
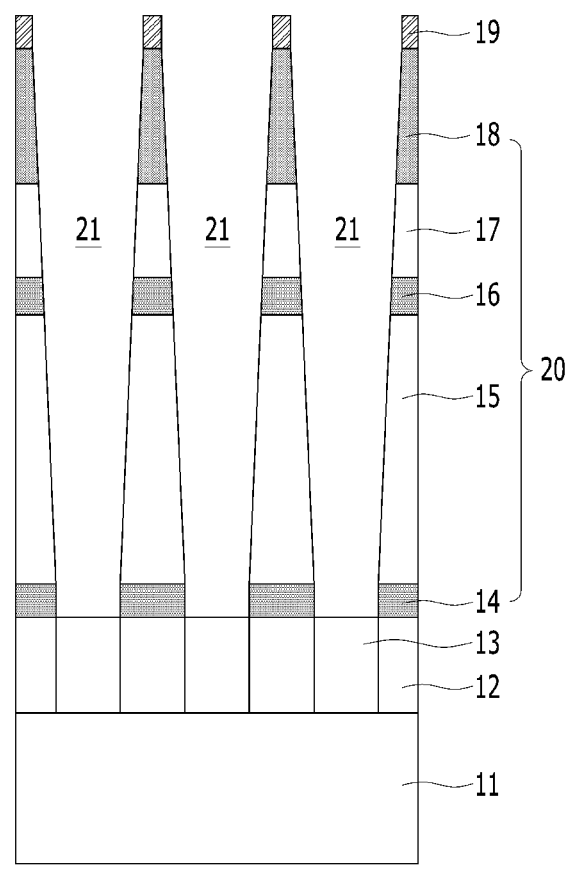
FIGS. 2A to 2I are cross-sectional views illustrating an example of a method for fabricating a semiconductor device in accordance with an embodiment of the present invention.

Referring to FIG. 2A, an inter-layer dielectric layer 12 may be formed over the lower structure 11. A plurality of contact plugs 13 may be formed to penetrate the inter-layer dielectric layer 12. The contact plugs 13 may penetrate the inter-layer dielectric layer 12 to be coupled to the lower structure 11. Although not illustrated, the lower structure 11 may include a semiconductor substrate, a buried word line formed in the semiconductor substrate, and a bit line over the buried word line.

The lower structure 11 may include a material appropriate for semiconductor processing. For example, the lower structure 11 may include a semiconductor substrate, and the semiconductor substrate may be formed of a silicon-containing material. The semiconductor substrate may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The semiconductor substrate may include other semiconductor materials, such as germanium. The semiconductor substrate may include a group-III/V semiconductor substrate, such as a compound semiconductor substrate such as GaAs. The semiconductor substrate may include a Silicon-On-Insulator (SOI) substrate. According to another embodiment of the present invention, when the lower structure 11 includes a semiconductor substrate, a mold structure 20 may be formed over the semiconductor substrate, and the contact plugs 13 and the inter-layer dielectric layer 12 may be positioned between the semiconductor substrate and the mold structure 20.

The inter-layer dielectric layer 12 may include silicon oxide. The inter-layer dielectric layer 12 may include high-density plasma oxide (HDP oxide), TEOS (TetraEthylOrthoSilicate), PE-TEOS (Plasma Enhanced TetraEthylOrthoSilicate), $O_3$-TEOS ($O_3$-Tetra Ethyl Ortho Silicate), USG (Undoped Silicate Glass), PSG (PhosphoSilicate Glass), BSG (Borosilicate Glass), BPSG (BoroPhosphoSilicate Glass), FSG (Fluoride Silicate Glass), SOG (Spin On Glass), TOSZ (Tonen SilaZene), or a combination thereof. Furthermore, the inter-layer dielectric layer 12 may be formed of silicon nitride, silicon oxynitride, or a low-k material having a low dielectric constant.

The contact plugs 13 may include a silicon plug, a metal plug, or a combination thereof. The contact plugs 13 may be referred to as storage node contact plugs.

A mold structure 20 may be formed over the contact plugs 13 and the inter-layer dielectric layer 12. The mold structure 20 may include the etch stop layer 14 and an alternating stack over the etch stop layer 14. In the alternating stack, a plurality of mold layers and a plurality of supporter layers may be alternately stacked. For example, the mold structure 20 may include a stack structure of the etch stop layer 14, the first mold layer 15, the first supporter layer 16, the second mold layer 17, and the second supporter layer 18. The etch stop layer 14 may be formed of a material having an etch selectivity with respect to the inter-layer dielectric layer 12 and the first mold layer 15. The etch stop layer 14 may include silicon nitride or silicon oxynitride. According to another embodiment of the present invention, the mold structure 20 may be formed by sequentially stacking the etch stop layer 14, one mold layer, and one supporter layer. According to another embodiment of the present invention, the mold structure 20 may be formed by alternately stacking at least three mold layers and at least three supporter layers over the etch stop layer 14.

The first mold layer 15 may include a dielectric material. The first mold layer 15 may be silicon oxide ($SiO_2$). The first mold layer 15 may be formed thicker than the first support layer 16. The first mold layer 15 may be formed by a deposition process, such as Chemical Vapor Deposition (CVD), Atomic Layer Deposition (ALD) or Physical Vapor Deposition (PVD). The first mold layer 15 may include silicon oxide doped with phosphorus or silicon oxide doped with boron. The first mold layer 15 may include USG, PSG, BSG, BPSG, FSG, or a combination thereof. Phosphorus-doped silicon oxide and boron-doped silicon oxide may be easily removed in the subsequent process because they have high etching rates with respect to the etching solution.

The first supporter layer 16 may be formed of a material having an etch selectivity with respect to the first mold layer 15 and the second mold layer 17. The first supporter layer 16 may include silicon nitride or silicon carbon nitride (SiCN).

The second mold layer 17 may include a dielectric material. The second mold layer 17 may be silicon oxide ($SiO_2$). The second mold layer 17 may be formed thicker than the first support layer 16. The second mold layer 17 may be formed by a deposition process such as Chemical Vapor Deposition (CVD), Atomic Layer Deposition (ALD) or Physical Vapor Deposition (PVD). The second mold layer 17 may include phosphorus-doped silicon oxide or boron-doped silicon oxide. The second mold layer 17 may include USG, PSG, BSG, BPSG, FSG, or a combination thereof. The first mold layer 15 and the second mold layer 17 may be made of the same material or different materials.

According to another embodiment of the present invention, the first mold layer 15 and the second mold layer 17 may be made of silicon materials, such as amorphous silicon and polysilicon.

The second supporter layer 18 may be formed of a material having an etch selectivity with respect to the second mold layer 17. The second supporter layer 18 may include silicon nitride or silicon carbon nitride (SiCN).

The first supporter layer 16 and the second supporter layer 18 may be made of the same material or different materials. Both the first supporter layer 16 and the second supporter layer 18 may be formed of silicon nitride. According to another embodiment of the present invention, the first supporter layer 16 may be formed of silicon nitride, and the second supporter layer 18 may be formed of silicon carbon nitride. The second supporter layer 18 may be thicker than the first supporter layer 16.

According to another embodiment of the present invention, another supporter layer may be further formed. For example, the supporter structure may be a multi-level supporter layer structure.

Subsequently, an opening 21 may be formed. The opening 21 may be formed by using the mask layer 19 and etching the mold structure 20. In order to form the opening 21, the second supporter layer 18, the second mold layer 17, the first supporter layer 16 and the first mold layer 15 may be sequentially etched by using the mask layer 19 as an etch barrier. The etching process for forming the opening 21 may stop at the etch stop layer 14. To form the opening 21, a dry etching process, a wet etching process, or a combination thereof may be used. The opening 21 may be referred to as a hole in which a lower electrode (or a storage node) is to be formed. The opening 21 may have a high aspect ratio. The opening 21 may have a high aspect ratio in which the height to width t ratio is approximately 10:1 or more.

Subsequently, the etch stop layer 14 may be etched to expose the upper surface of the contact plugs 13 below the opening 21.

The mask layer 19 for forming the opening 21 may include a hard mask material, a photoresist, or a combination thereof. For example, the hard mask material may include boron-doped polysilicon, amorphous silicon, an oxide, amorphous carbon, silicon oxynitride, or a combination thereof. The photoresist may include ArF photoresist or EUV photoresist.

The opening 21 may be formed by a double patterning process. For example, the mask layer 19 for forming the opening 21 may be a mesh type formed by combining two spacer patterning techniques.

A mold structure 20 including a plurality of openings 21 may be formed by a series of etching processes as described above. The mold structure 20 may be a structure in which the etch stop layer 14, the first mold layer 15, the first supporter layer 16, the second mold layer 17, and the second supporter layer 18 are stacked in the mentioned order.

Figure 2B:
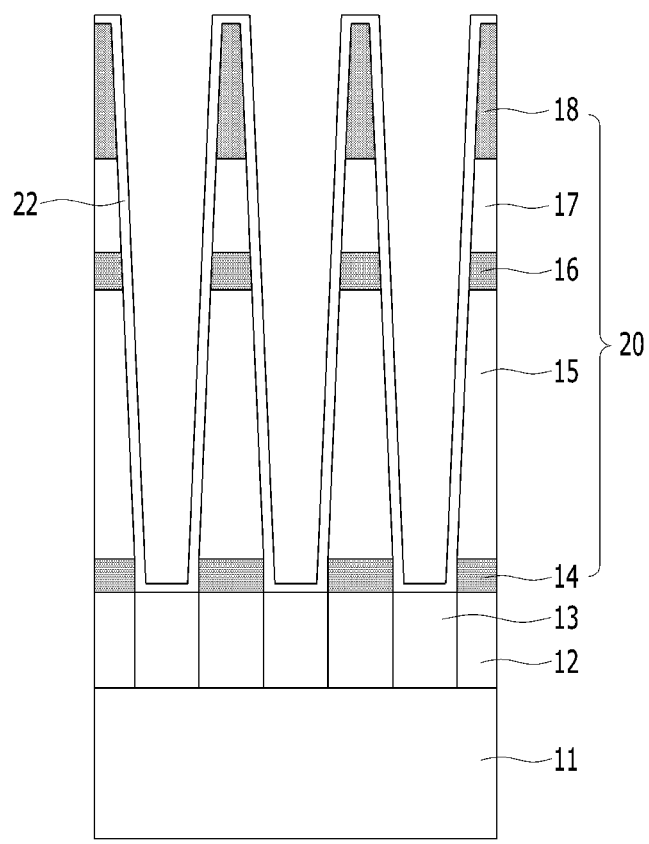

Referring to FIG. 2B, after the mask layer 19 is removed, a protective layer 22 may be formed over the opening 21 and the mold structure 20. The protective layer 22 may not fill the opening 21. The protective layer 22 may conformally cover the sidewalls and the bottom surface of the opening 21. The protective layer 22 may cover the upper surface of the mold structure 20. The protective layer 22 may include a material which is different from that of the mold structure 20. The protective layer 22 may include a material having an etch selectivity with respect to the first mold layer 15 and the second mold layer 17. The protective layer 22 may be in direct contact with the contact plugs 13.

The protective layer 22 may include a non-polycrystalline material. The protective layer 22 may include an amorphous material. The protective layer 22 may include a conductive material. The protective layer 22 may be formed of an amorphous conductive material. According to the embodiment of the present invention, the protective layer 22 may include niobium or titanium nitride. The protective layer 22 may include amorphous niobium or amorphous titanium nitride. Amorphous niobium or amorphous titanium nitride may be a conductive material.

Figure 2C:
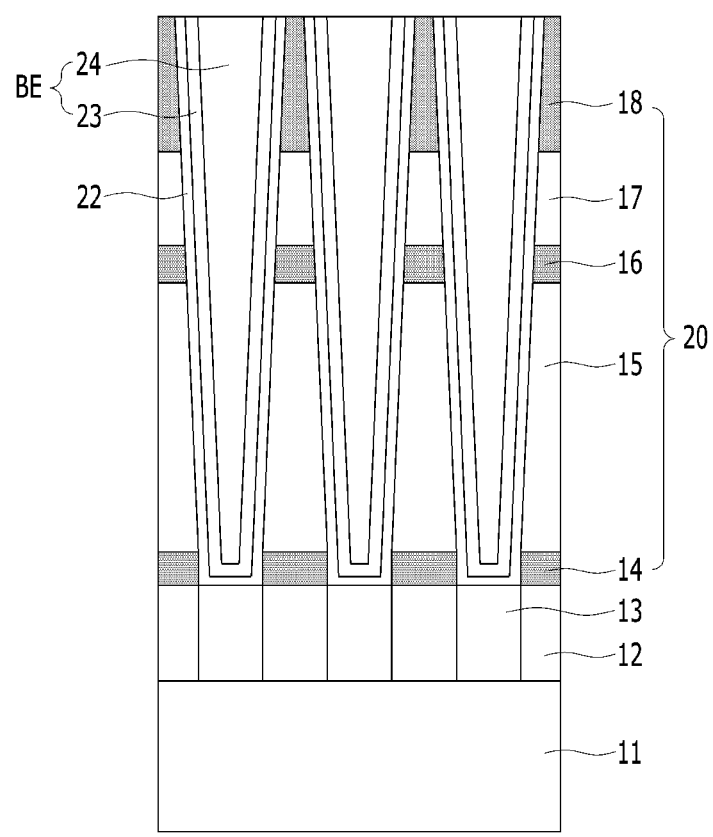

Referring to FIG. 2C, the lower electrode BE may be formed in the opening 21. The lower electrode BE may fill the inside of the opening 21 over the protective layer 22. The lower electrode BE may be a hybrid type. In order to form the hybrid-type lower electrode BE, a conductive material may be deposited over the protective layer 22 to gap-fill the opening 21 and then planarization may be performed. The lower electrode BE may include polysilicon, a metal, a metal nitride, a conductive metal oxide, a metal silicide, a noble metal, or a combination thereof. The lower electrode BE may include at least one among titanium (Ti), titanium nitride (TiN), tantalum (Ta), tantalum nitride (TaN), titanium aluminum nitride (TiAlN), tungsten (W) or tungsten nitride (WN), ruthenium (Ru), ruthenium oxide (RuO$_2$), iridium (Ir), iridium oxide (IrO$_2$), platinum (Pt), and a combination thereof. The lower electrode BE may include titanium nitride (TiN). The lower electrode BE may include titanium nitride (ALD-TiN) formed by Atomic Layer Deposition (ALD). According to the embodiment of the present invention, the lower electrode BE may include a stack of the cylindrical electrode 23 and the pillar-shaped electrode 24. The cylindrical electrode 23 may be titanium nitride, and the pillar-shaped electrode 24 may be polysilicon. The cylindrical electrode 23 may include polycrystalline titanium nitride, and the polycrystalline titanium nitride may include a plurality of grain boundaries. Polycrystalline titanium nitride may have a lower resistance than amorphous titanium nitride and amorphous niobium. Also, polycrystalline titanium nitride may have a greater effect of suppressing bending than amorphous titanium nitride and amorphous niobium. The cylindrical electrode 23 may not include amorphous titanium nitride and amorphous niobium.

While the lower electrode BE is formed, a portion of the protective layer 22 may be removed. In other words, a portion of the protective layer 22 may be removed from the uppermost surface of the mold structure 20. Therefore, the protective layer 22 may remain only inside the opening 21. The protective layer 22 may cover the outer wall and the bottom surface of the lower electrode BE. The protective layer 22 may directly contact the outer wall and the bottom surface of the cylindrical electrode 23. The pillar-shaped electrode 24 may not contact the protective layer 22. The protective layer 22 may have a cylindrical shape which is similar to the cylindrical electrode 23.

The protective layer 22 may be positioned between the outer wall of the lower electrode BE and the first supporter layer 16. The protective layer 22 may be positioned between the outer wall of the lower electrode BE and the second supporter layer 18. The protective layer 22 may be positioned between the outer wall of the lower electrode BE and the first mold layer 15. The protective layer 22 may be positioned between the outer wall of the lower electrode BE and the second mold layer 17. As described above, the protective layer 22 may have a continuous shape covering the outer wall and the bottom surface of the lower electrode BE, and it may conformally cover the bottom surface and the side walls of the opening 21. The protective layer 22 and the cylindrical electrode 23 may have the same thickness. According to another embodiment of the present invention, the protective layer 22 may be thinner than the cylindrical electrode 23.

Figure 2D:
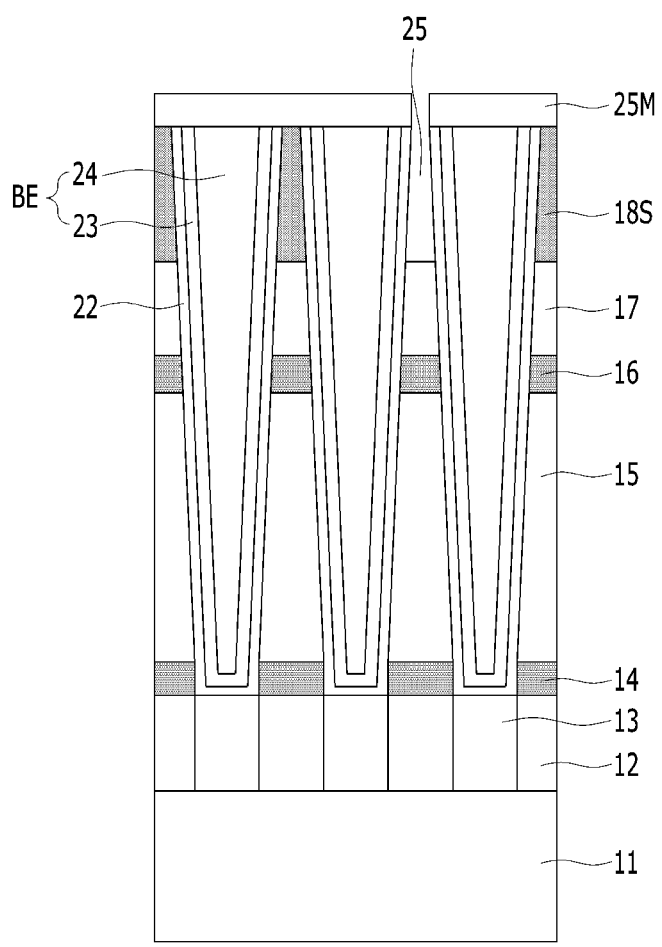

Referring to FIG. 2D, a supporter mask layer 25M may be formed. The supporter mask layer 25M may include a photoresist or amorphous carbon.

Subsequently, a portion of the second supporter layer 18 may be etched by using the supporter mask layer 25M. An upper-level supporter opening 25 and an upper-level supporter 18S may be formed by etching the second supporter layer 18.

The upper-level supporter 18S may be a plate-shaped supporter. The upper-level supporter 18S may contact the upper outer wall of the lower electrode BE. Some surfaces of the second mold layer 17 may be exposed by the upper-level supporter 18S. The upper-level supporter 18S may be shaped to partially surround the upper outer wall of the lower electrode BE. The upper-level supporter 18S may prevent the lower electrodes BE from collapsing in the subsequent process of removing the second mold layer 17.

From the perspective of a top view, the upper-level supporter opening 25 may be shaped to partially expose the upper outer walls of the neighboring three lower electrodes BE. According to another embodiment of the present invention, the upper-level supporter opening 25 may be shaped to partially expose the upper outer walls of at least four lower electrodes BE. The upper-level supporter opening 25 may have a cross section of a triangle, a square, a parallelogram, a pentagon, a hexagon or a honeycomb.

The upper outer walls of all the lower electrodes BE may be partially exposed by the upper-level supporter opening 25. This may be referred to as an 'all-open lower electrode array'.

According to another embodiment of the present invention, the upper outer wall of at least one lower electrode BE may not be exposed by the upper-level supporter opening 25. For example, among the lower electrodes BE, there may be at least one lower electrode BE that is not exposed by the upper-level supporter opening 25 but is fully covered by the upper-level supporter 18S. This may be referred to as a 1-span lower electrode array.

During the etching process for forming the upper-level supporter 18S, the protective layer 22 is not etched.

Figure 2E:
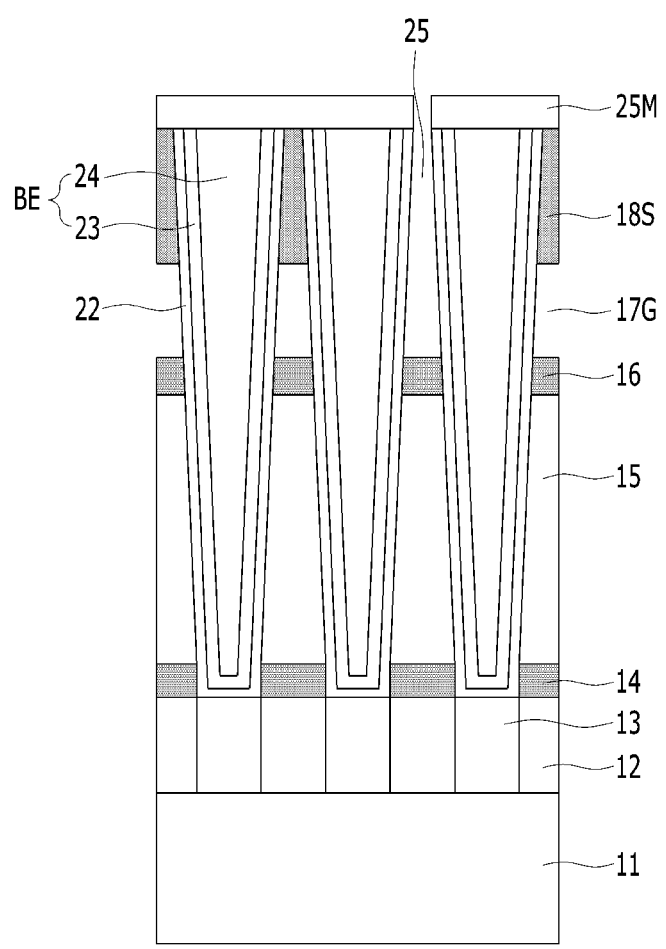

Referring to FIG. 2E, the second mold layer 17 below the upper-level supporter opening 25 may be removed. The second mold layer 17 may be removed only by a wet dip-out process. The second mold layer 17 may be selectively removed, and as a result, the surface of the first supporter layer 16 may be exposed. The wet dip-out process for removing the second mold layer 17 may be performed by using an etching solution capable of selectively removing the second mold layer 17. When the second mold layer 17 includes silicon oxide, the second mold layer 17 may be removed by a wet etching process using hydrofluoric acid (HF).

During the wet dip-out process for removing the second mold layer 17, the protective layer 22 is not etched. After the second mold layer 17 is removed, an upper-level air gap 17G may be formed between the upper-level supporter 18S and the first supporter layer 16. The upper-level air gap 17G may be defined by the process of removing the second mold layer 17 and it may refer to the space from which the second mold layer 17 is removed. As the second mold layer 17 is removed, a portion of the outer wall of the protective layer 22 (hereinafter, which will be referred to as 'upper-level outer wall') may be simultaneously exposed. The upper-level outer wall of the protective layer 22 may be positioned at a level lower than the uppermost surface of the protective layer 22. The upper-level outer wall of the protective layer 22 does not refer to the uppermost outer wall of the protective layer 22. The upper outer wall of the protective layer 22 may not be exposed by the upper-level supporter 18S. The upper-level outer wall of the protective layer 22 may be lower than the upper outer wall of the protective layer 22. The upper-level outer wall of the protective layer 22 may be lower than the upper-level supporter 18S. The height of the upper-level outer wall of the protective layer 22 may correspond to the distance between the upper-level supporter 18S and the first supporter layer 16.

The uppermost surface of the lower electrode BE, the upper surface of the upper-level supporter 18S, and the uppermost surface of the protective layer 22 may be positioned at the same level.

Figure 2F:
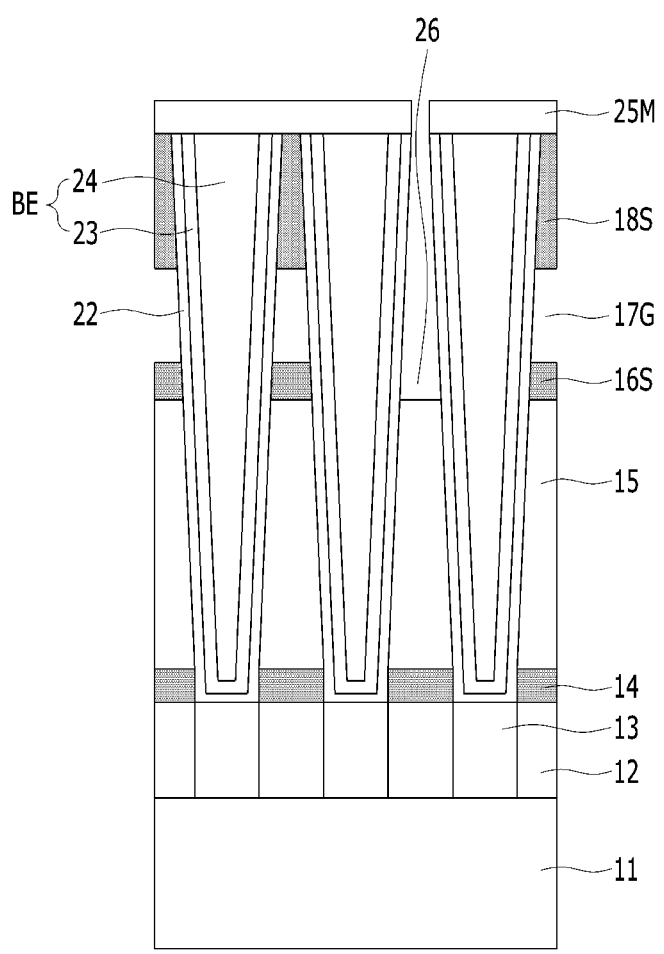

Referring to FIG. 2F, the first supporter layer 16 may be etched by using the supporter mask layer 25M. The etching process of the first supporter layer 16 may be performed by self-aligned etching using the supporter mask layer 25M. A lower-level supporter 16S may be formed by the etching process of the first supporter layer 16. The lower-level supporter 16S may include a lower-level supporter opening 26. The lower-level dielectric supporter opening 26 may overlap with the upper-level supporter opening ('25' in FIG. 2E). From the perspective of a top view, the upper-level supporter opening 25 and the lower-level dielectric supporter opening 26 may be of the same shape.

During the etching process for forming the lower-level supporter 16S, the protective layer 22 are not etched.

Figure 2G:
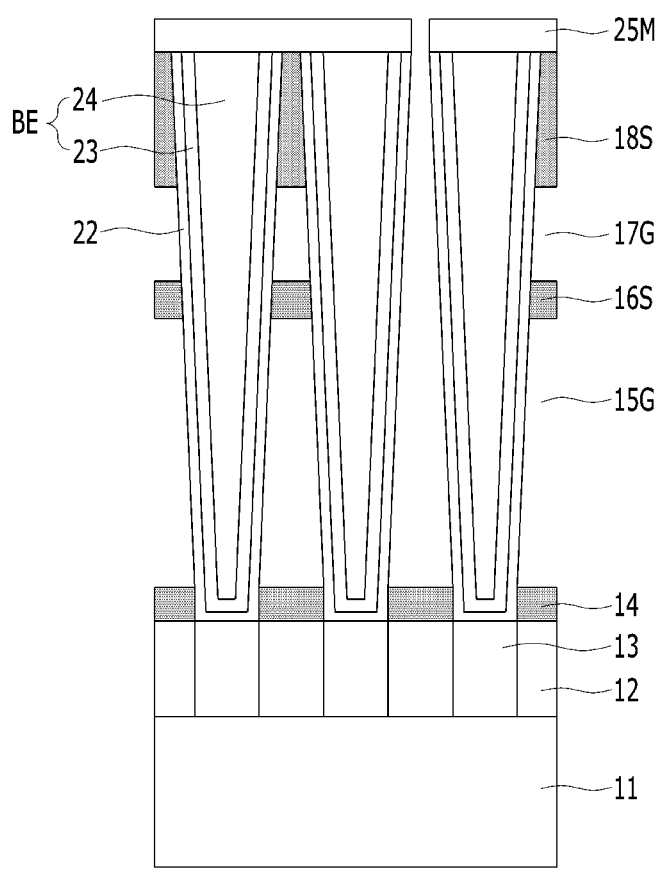

Referring to FIG. 2G, the first mold layer 15 below the lower-level supporter opening 26 may be removed. The first mold layer 15 may be removed by a wet dip-out process. The first mold layer 15 may be selectively removed to expose the surface of the etch stop layer 14. The wet dip-out process for removing the first mold layer 15 may be performed by using an etching solution capable of selectively removing the first mold layer 15. When the first mold layer 15 includes silicon oxide, the first mold layer 15 may be removed by a wet etching process using hydrofluoric acid (HF).

During the wet dip-out process for removing the second mold layer 15, the protective layer 22 is not etched. After the first mold layer 15 is removed, a lower-level air gap 15G may be formed between the lower-level supporter 16S and the etch stop layer 14. The lower-level air gap 15G may be defined by the removal process of the first mold layer 15. The lower-level air gap 15G may refer to the space from which the first mold layer 15 is removed.

As the first mold layer 15 is removed, a portion of the outer wall of the protective layer 22 (hereinafter, which will be referred to as a 'lower-level outer wall') may be simultaneously exposed. The lower-level outer wall of the protective layer 22 may be positioned at a level lower than the uppermost surface of the protective layer 22. The lower-level outer wall of the protective layer 22 may not refer to the lowermost level outer wall of the protective layer 22. The lowermost level outer wall of the protective layer 22 may not be exposed by the etch stop layer 14. The lower-level outer wall of the protective layer 22 may be lower than the upper-level outer wall of the protective layer 22. The lower-level outer wall of the protective layer 22 may be a lower level than the lower-level supporter 16S. The height of the lower-level outer wall of the protective layer 22 may correspond to the distance between the lower-level supporter 16S and the etch stop layer 14.

As described above, during the wet dip-out process for removing the first mold layer 15 and the second mold layer 17, the protective layer 22 may serve to protect surface of the lower electrode BE from being attacked. For example, as the protective layer 22 suppresses the penetration of a chemical during the wet dip-out process, the phenomenon that the cylindrical electrode 23 is etched may be prevented.

Figure 2H:
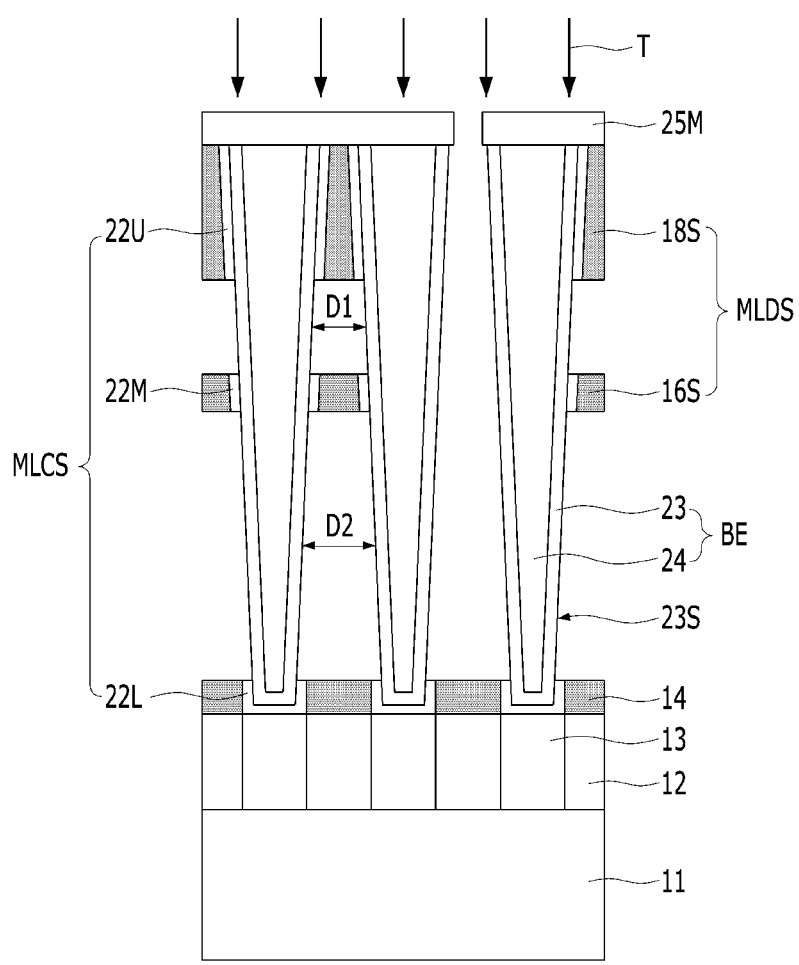

Referring to FIG. 2H, a trimming process T may be performed. The trimming process T may remove impurities such as metal groups which remains after the first and second mold layers 15 and 17 are removed. The lateral spacing distance between the neighboring lower electrodes BE may be increased by the trimming process T. A portion of the protective layer 22 may be removed by the trimming process T.

The trimming process T may include a partial etching process of the protective layer 22. The trimming process T may include a wet etching process of the protective layer 22. The trimming process T may include a cleaning process, and the cleaning process may be performed by using a mixture of ammonium hydroxide ($NH_4OH$), hydrogen peroxide ($H_2O_2$) and water ($H_2O$). The trimming process T may be a process of cutting portions of the protective layer 22 exposed by the upper-level air gap 17G and the lower-level air gap 15G. Here, portions of the protective layer 22 to be cut may include the upper-level outer wall and the lower-level outer wall of the protective layer 22. Since the protective layer 22 is first exposed to the trimming process T, the surface roughness of the cylindrical electrode 23 of the lower electrode BE may not be deteriorated. The protective layer 22 may be a sacrificial material for preventing the loss of the lower electrode BE, and it may be a material that is etched before the lower electrode BE during the trimming process T. Since the protective layer 22 is an amorphous material, the trimming process T may etch the protective layer 22 at a uniform etching rate. Accordingly, even though the outer wall of the lower electrode BE is exposed after the protective layer 22 is etched, the surface roughness of the cylindrical electrode 23 may not be deteriorated.

As a comparative example, when the protective layer 22 is omitted, during the trimming process T, the polycrystalline cylindrical electrode 23 may be etched with a non-uniform surface along a grain boundary having a relatively high surface energy. Accordingly, since the surface of the cylindrical electrode 23 becomes non-uniform (that is, the surface roughness is poor), the thickness distribution of the dielectric layer 27 may be deteriorated upon deposition of a dielectric layer 27, which is to be formed subsequently. When the thickness distribution of the dielectric layer 27 is deteriorated, an electric field applied to the dielectric layer 27 may be increased at a local position where the thickness is thin, which may be a factor that deteriorates the operation failure due to leakage current of the dielectric layer 27.

As a comparative example, when the protective layer 22 is omitted and the cylindrical electrode 23 includes amorphous titanium nitride or amorphous niobium, the surface roughness of the cylindrical electrode 23 may be prevented from being deteriorated. However, the amorphous titanium nitride and the amorphous niobium that are used as the cylindrical electrode 23 have a problem of high resistance and bending.

According to the embodiment of the present invention, since the outer wall of the lower electrode BE is protected by the protective layer 22, it is possible to improve the surface roughness of the cylindrical electrode 23 during the trimming process T. Accordingly, leakage current may be suppressed by making the thickness distribution of the subsequent dielectric layer 27 uniform. Also, according to the embodiment of the present invention, since the cylindrical electrode 23 includes a polycrystalline material, it is possible to lower the resistance of the cylindrical electrode 23 and suppress bending.

As a comparative example, when the protective layer 22 includes a polycrystalline material, the surface of the protective layer 22 may be unevenly etched along a grain boundary having a relatively high surface energy during the trimming process T. Due to the un-uniform etching of the protective layer 22, the surface of the cylindrical electrode 23 may be partially exposed before the trimming process T is completed. Accordingly, when the trimming process T is completed, the surface of the cylindrical electrode 23 may be etched un-uniformly, resulting in a poor surface roughness of the cylindrical electrode 23.

According to the embodiment of the present invention, as the protective layer 22 is formed of an amorphous material, the trimming process T may be performed at a uniform etching rate, thereby preventing deterioration of the surface roughness of the cylindrical electrode 23.

As portions of the protective layer 22 are cut by the trimming process T, the upper-level protective layer pattern 22U, the middle-level protective layer pattern 22M, and the lower-level protective layer pattern 22L may be formed.

The upper-level protective layer pattern 22U may directly contact the upper-level supporter 18S, and the upper-level protective layer pattern 22U may be positioned between the upper outer wall of the lower electrode BE and the upper-level supporter 18S. The upper-level protective layer pattern 22U may be positioned between the cylindrical electrode 23 of the lower electrode BE and the upper-level supporter 18S.

The middle-level protective layer pattern 22M may directly contact the lower-level supporter 16S, and the middle-level protective layer pattern 22M may be positioned between the middle outer wall of the lower electrode BE and the lower-level supporter 16S. The middle-level protective layer pattern 22M may be positioned between the cylindrical electrode 23 of the lower electrode BE and the lower-level supporter 16S.

The lower-level protective layer pattern 22L may contact the bottom surface of the lower electrode BE and the lowermost sidewalls continuous from the bottom surface. The lower-level protective layer pattern 22L may directly contact the etch stop layer 14.

By the trimming process T, as portions of the protective layer 22 are removed, the lateral distances D1 and D2 between the neighboring lower electrodes BE may be widened. By the trimming process T, the outer wall surface 23S of the cylindrical electrode 23 of the lower electrode BE may be exposed.

The outer wall surface 23S of the cylindrical electrode 23 may include an upper-level outer wall and a lower-level outer wall. The upper-level outer wall of the cylindrical electrode 23 may be lower than the upper-level protective layer pattern 22U and the upper-level supporter 18S. The height of the upper-level outer wall of the cylindrical electrode 23 may correspond to the distance between the upper-level supporter 18S and the etch stop layer 14. The lower-level outer wall of the cylindrical electrode 23 may be lower than the middle-level protective layer pattern 22M and the lower-level supporter 16S. The height of the lower-level outer wall of the cylindrical electrode 23 may correspond to the distance between the lower-level supporter 16S and the etch stop layer 14.

The middle-level protective layer pattern 22M may be vertically spaced apart from the upper-level protective layer pattern 22U. The lower-level protective layer pattern 22L may be vertically spaced apart from the middle-level protective layer pattern 22M. The upper-level protective layer pattern 22U may have a shape surrounding a portion of the upper outer wall of the cylindrical electrode 23. The middle-level protective layer pattern 22M may be positioned at a lower level than the upper-level protective layer pattern 22U, but it may have a shape surrounding a portion of the middle outer wall of the cylindrical electrode 23. The lower-level protective layer pattern 22L may be positioned at a lower level than the middle-level protective layer pattern 22M, but it may have a shape surrounding the bottom surface of the cylindrical electrode 23 and the lowermost sidewalls continuous from the bottom surface. The distance between the upper-level protective layer pattern 22U and the middle-level protective layer pattern 22M may be shorter than the distance between the middle-level protective layer pattern 22M and the lower-level protective layer pattern 22L.

Since the protective layer 22 includes a conductive material, the lower-level protective layer pattern 22L may be electrically connected to the lower electrode BE and the contact plugs 13. The lower-level protective layer pattern 22L, the upper-level protective layer pattern 22U, and the middle-level protective layer pattern 22M may include amorphous titanium nitride or amorphous niobium.

The lower-level protective layer pattern 22L may include amorphous conductive niobium nitride. Amorphous conductive niobium nitride may be formed by combining amorphous niobium which is used as the protective layer 22 with nitrogen of titanium nitride which is used as the cylindrical electrode 23. The upper-level protective layer pattern 22U and the middle-level protective layer pattern 22M may also include amorphous conductive niobium nitride.

As a comparative example, when the protective layer 22 is a dielectric metal oxide such as niobium oxide, titanium oxide, or titanium oxynitride, the protective layer 22 may have to be removed from the bottom portion of the lower electrode BE to secure a current path between the lower electrode BE and the contact plugs 13. Therefore, the comparative example not only requires an etching process for removing the protective layer 22 from the bottom portion of the lower electrode BE, but also has a high difficulty in the etching process.

According to the embodiment of the present invention, since the protective layer 22 is a conductive material, the protective layer 22 may not have to be removed from the bottom portion of the lower electrode BE.

The upper surface of the middle-level protective layer pattern 22M and the upper surface of the lower-level supporter 16S may be positioned at the same level.

Since the bottom surface of the lower electrode BE is embedded in the lower-level protective layer pattern 22L, structural stability of the lower electrode BE may be increased from the subsequent process.

The trimming process T may be performed in a state that a supporter mask layer 25M remains. According to another embodiment of the present invention, the trimming process T2 may be performed after the supporter mask layer 25M is removed.

By the series of processes described above, a multi-level supporter MLDS supporting the outer wall of the lower electrode BE and a multi-level protective structure MLCS may be formed. The multi-level supporter MLDS may include an upper-level supporter 18S and a lower-level supporter 16S, and the multi-level protective structure MLCS may include the upper-level protective layer pattern 22U, the middle-level protective layer pattern 22M, and the lower-level protective layer pattern 22L.

Figure 2I:
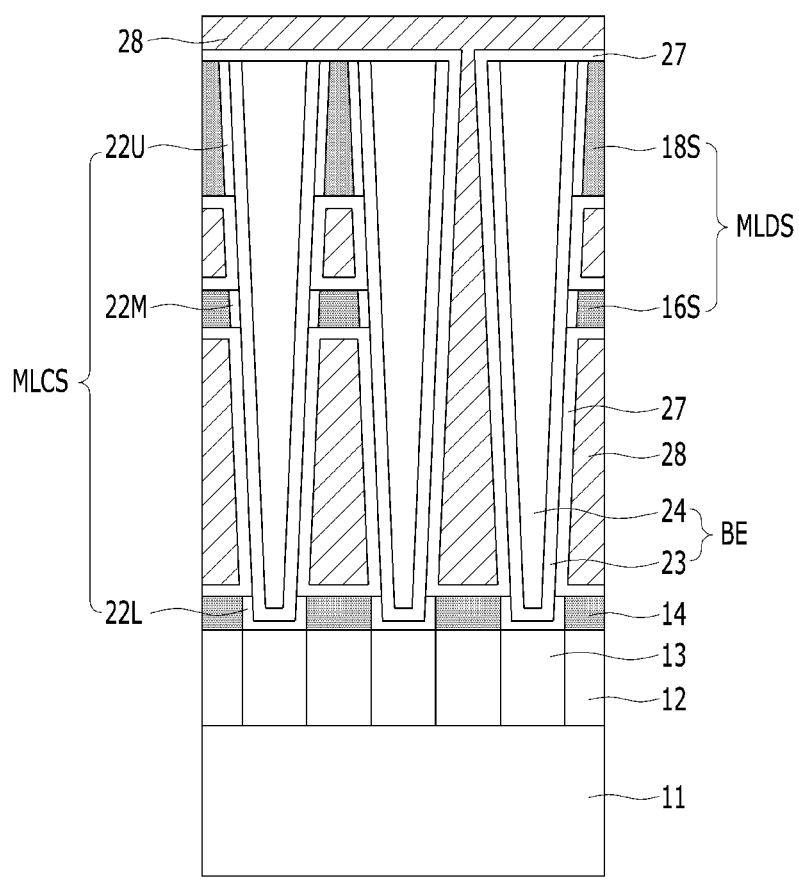

Referring to FIG. 2I, after the supporter mask layer 25M is removed, a dielectric layer 27 may be formed over the lower electrode BE. The dielectric layer 27 may include a high-k material having a higher dielectric constant than silicon oxide. High-k materials include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$), or strontium titanium oxide ($SrTiO_3$). According to another embodiment of the present invention, the dielectric layer 27 may be formed of a composite layer including two or more layers of the high-k material mentioned above. According to the embodiment of the present invention, the dielectric layer 27 may be formed of a zirconium oxide-based material having good leakage current characteristics while sufficiently lowering the equivalent oxide film thickness (EOT). For example, it may include a ZAZ ($ZrO_2/Al_2O_3/ZrO_2$) stack. According to yet another embodiment of the present invention, the dielectric layer 27 may include a $TiO_2/ZrO_2/Al_2O_3/ZrO_2$ stack, a $TiO_2/HfO_2/Al_2O_3/HfO_2$ stack, a $Ta_2O_5/ZrO_2/Al_2O_3/ZrO_2$ stack, or a $Ta_2O_5/HfO_2/Al_2O_3/HfO_2$ stack.

The dielectric layer 27 may cover portions of the multi-level supporter MLDS and portions of the multi-level protective structure MLCS.

Since the surface on which the dielectric layer 27 is to be formed, that is, the surface roughness of the cylindrical electrode 23 is improved, it is possible to suppress the leakage current by making the thickness distribution of the dielectric layer 27 uniform when the dielectric layer 27 is formed.

Next, an upper electrode 28 may be formed over the dielectric layer 27. The upper electrode 28 may fill the space between the neighboring lower electrodes BE. The upper electrode 28 may extend to cover the upper portions of the lower electrodes BE. The upper electrode 28 may include a conductive material. The upper electrode 28 may be formed by stacking a liner electrode, a gap-fill electrode, and a low-resistance electrode (not shown) in the mentioned order. The liner electrode of the upper electrode 28 may include titanium nitride, and the gap-fill electrode of the upper electrode 28 may include silicon germanium. The low-resistance electrode of the upper electrode 28 may include tungsten or tungsten nitride.

FIGS. 3A to 3D are cross-sectional views illustrating an example of a method for fabricating a semiconductor device in accordance with an embodiment of the present invention. FIGS. 3A to 3D may be similar to the fabrication method shown in FIGS. 2A to 2I. Hereinafter, a detailed description on the same components may be omitted.

An upper-level supporter opening 25 and an upper-level supporter 18S may be formed by a series of the processes illustrated in FIGS. 2A to 2E. Subsequently, the second mold layer 17 below the upper-level supporter opening 25 may be removed. As the second mold layer 17 is removed, an upper-level air gap 17G may be formed between the first supporter layer 16 and the upper-level supporter 18S. A portion of the protective layer 22 may be exposed by the upper-level air gap 17G.

Figure 3A:
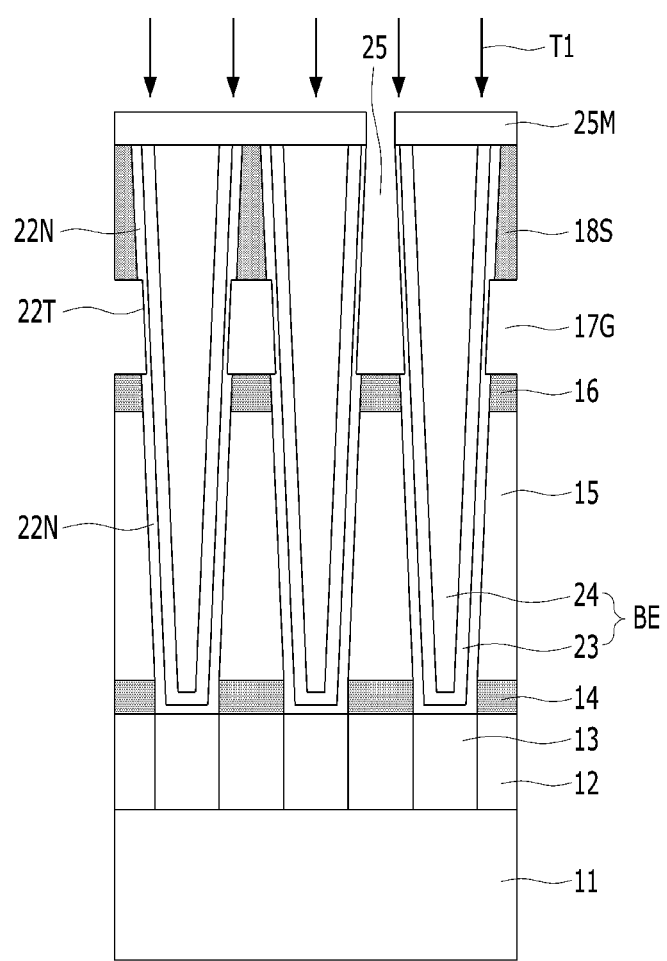
FIGS. 3A to 3D are cross-sectional views illustrating an example of a method for fabricating a semiconductor device in accordance with an embodiment of the present invention.

Subsequently, as illustrated in FIG. 3A, a primary trimming process T1 may be performed. The primary trimming process T1 may remove impurities such as metal groups that remain after the second mold layer 17 is removed. The distance between the neighboring lower electrodes BE may be increased by the primary trimming process T1. A portion of the protective layer 22 may be removed by the primary trimming process T1.

The primary trimming process T1 may include a partial etching process of the protective layer 22. The primary trimming process T1 may include a wet etching process of the protective layer 22. The primary trimming process T1 may include a cleaning process, and the cleaning process may be performed by using a mixture of ammonium hydroxide ($NH_4OH$), hydrogen peroxide ($H_2O_2$) and water ($H_2O$). The primary trimming process T1 may be a process of partially etching portions (the upper-level outer wall) of the protective layer 22 exposed by the upper-level air gap 17G. Since the protective layer 22 is first exposed to the primary trimming process T1, the surface roughness of the cylindrical electrode 23 of the lower electrode BE may not be deteriorated.

As a portion of the protective layer 22 is removed, the upper-level air gap 17G may be laterally expanded. After the primary trimming process T1, a non-trimmed protective layer 22N and a partially trimmed protective layer 22T may be formed. The non-trimmed protective layer 22N may refer to a protective layer that is not exposed to the primary trimming process T1, and the partially trimmed protective layer 22T may refer to a protective layer whose thickness becomes thinner by the primary trimming process T1. The non-trimmed protective layer 22N and the partially trimmed protective layer 22T may be formed to be continuous with each other to cover the cylindrical electrode 23 of the lower electrode BE.

The non-trimmed protective layer 22N may include an upper-level non-trimmed protective layer 22N disposed between the upper-level supporter 18S and the cylindrical electrode 23. The non-trimmed protective layer 22N may include a lower-level non-trimmed protective layer 22N disposed between the first mold layer 15 and the cylindrical electrode 23.

The first trimming process T1 may be performed while the supporter mask layer 25M remains. According to another embodiment of the present invention, the first trimming process T1 may be performed after the supporter mask layer 25M is removed.

Figure 3B:
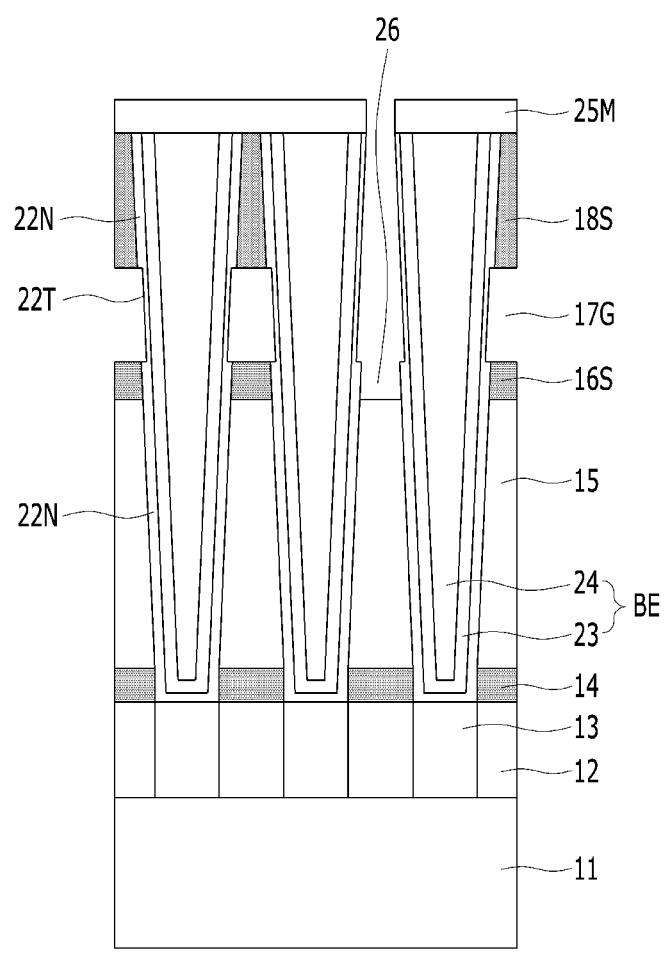

Referring to FIG. 3B, the first supporter layer 16 may be etched by using the supporter mask layer 25M. The etching process of the first supporter layer 16 may be performed by a self-aligned etching process using the supporter mask layer 25M. A lower-level supporter 16S may be formed by the etching process of the first supporter layer 16. The lower-level supporter 16S may include a plurality of lower-level supporter openings 26. The lower-level supporter openings 26 may overlap with the upper-level supporter openings 25. From the perspective of a top view, the upper-level supporter openings 25 and the lower-level supporter openings 26 may have the same shape.

During the etching process for forming the lower-level supporter 16S, the non-trimmed protective layer 22N and the partially trimmed protective layer 22T are not etched.

Figure 3C:
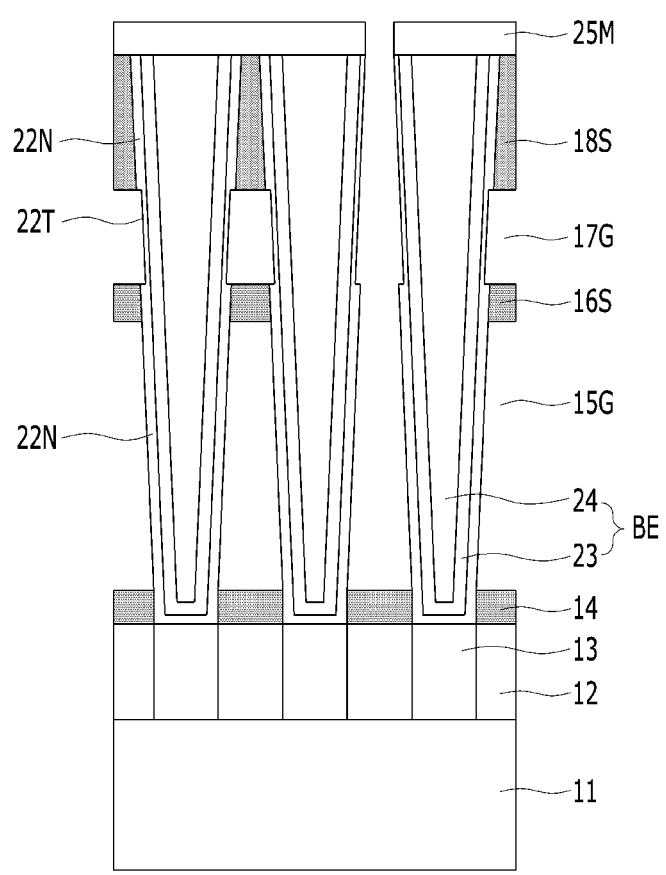

Referring to FIG. 3C, the first mold layer 15 below the lower-level supporter openings 26 may be removed. The first mold layer 15 may be removed by a wet dip-out process. The first mold layer 15 may be selectively removed to expose the surface of the etch stop layer 14. The wet dip-out process for removing the first mold layer 15 may be performed by using an etching solution capable of selectively removing the first mold layer 15. When the first mold layer 15 includes silicon oxide, the first mold layer 15 may be removed by a wet etching process using hydrofluoric acid (HF).

During the wet dip-out process for removing the second mold layer 15, the non-trimmed protective layer 22N and the partially trimmed protective layer 22T are not etched. After the first mold layer 15 is removed, a lower-level air gap 15G may be formed between the lower-level supporter 16S and the etch stop layer 14. The lower-level air gap 15G may be defined by the removal process of the first mold layer 15. The non-trimmed protective layer 22N may be exposed by the lower-level air gap 15G. The partially trimmed protective layer 22T may be exposed by the upper-level air gap 17G.

Figure 3D:
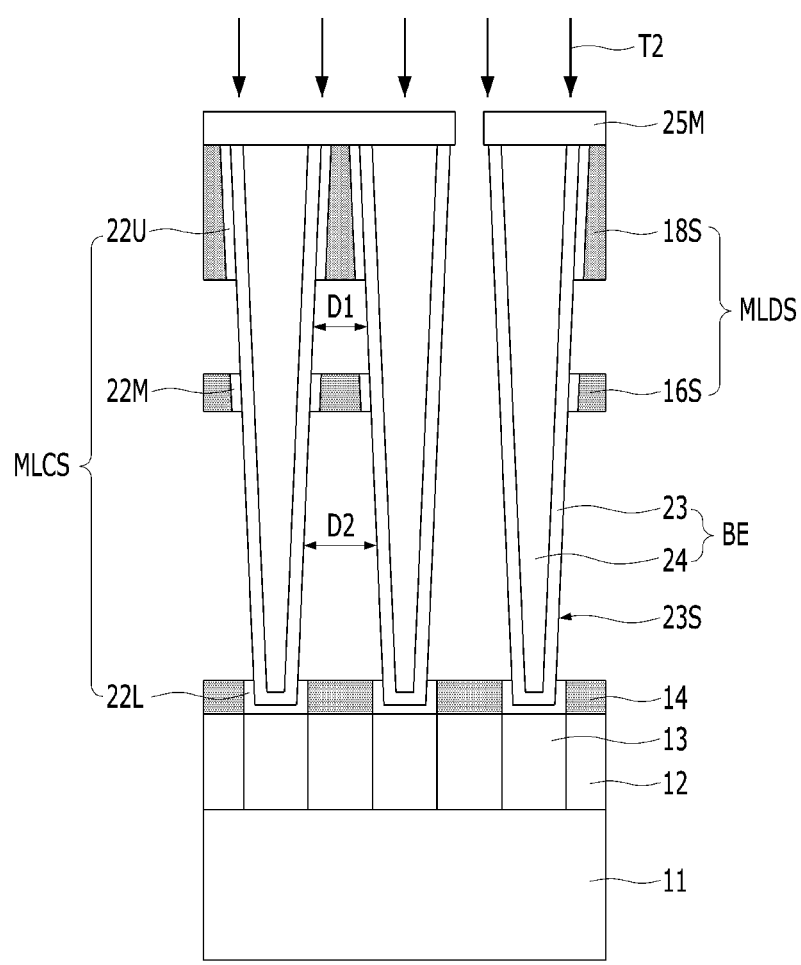

Referring to FIG. 3D, a secondary trimming process T2 may be performed. The secondary trimming process T2 may increase the spacing distance between the neighboring lower electrodes BE. The second trimming process T2 may remove impurities such as metal groups remaining after the first mold layer 15 is removed. The spacing distance between the neighboring lower electrodes BE may be increased by the secondary trimming process T2. A portion of the non-trimmed protective layer 22N and the partially trimmed protective layer 22T may be removed by the secondary trimming process T2. Here, the portion of the non-trimmed protective layer 22N which is removed herein may be a lower-level non-trimmed protective layer 22N exposed by the lower-level air gap 15G. The upper-level non-trimmed protective layer 22N between the upper-level supporter 18S and the cylindrical electrode 23 may not be removed.

The secondary trimming process T2 may include an etching process of the non-trimmed protective layer 22N and the partially trimmed protective layer 22T. The secondary trimming process T2 may include a wet etching process of the non-trimmed protective layer 22N and the partially trimmed protective layer 22T. The secondary trimming process T2 may include a cleaning process, and the cleaning process may be performed by using a mixture of ammonium hydroxide ($NH_4OH$), hydrogen peroxide ($H_2O_2$) and water ($H_2O$). The secondary trimming process T2 may be a process of cutting the partially trimmed protective layer 22T which is exposed by the upper-level air gap 17G and the lower-level non-trimmed protective layer 22N which is exposed by the lower-level air gap 15G. Since the partially trimmed protective layer 22T and the lower-level non-trimmed protective layer 22N are first exposed to the secondary trimming process T2, the surface roughness of the cylindrical electrode 23 of the lower electrode BE may not be deteriorated.

As a result of the second trimming process T2, the upper-level protective layer pattern 22U, the middle-level protective layer pattern 22M, and the lower-level protective layer pattern 22L may be formed. The upper-level protective layer pattern 22U, the middle-level protective layer pattern 22M, and the lower-level protective layer pattern 22L may be formed by cutting the partially trimmed protective layer 22T and the non-trimmed protective layer 22N. The upper-level protective layer pattern 22U may refer to the upper-level non-trimmed protective layer 22N remaining by fully cutting the partially trimmed protective layer 22T. The middle-level protective layer pattern 22M and the lower-level protective layer pattern 22L may refer to a portion remaining by partially cutting the lower-level non-trimmed protective layer 22N.

The upper-level protective layer pattern 22U may directly contact the upper-level supporter 18S, and it may be positioned between the upper outer wall of the lower electrode BE and the upper-level supporter 18S.

The middle-level protective layer pattern 22M may directly contact the lower-level supporter 16S, and it may be positioned between the middle outer wall of the lower electrode BE and the lower-level supporter 16S.

The lower-level protective layer pattern 22L may contact the bottom of the lower electrode BE and the sidewalls of the lowermost portion which is continuous from the bottom surface of the lower electrode BE. The lower-level protective layer pattern 22L may directly contact the etch stop layer 14.

The distance D1 and D2 between the neighboring lower electrodes BE may be widened as the partially trimmed protective layer 22T and a portion of the lower-level non-trimmed protective layer 22N are cut by the secondary trimming process T2. A portion 23S of the surface of the cylindrical electrode 23 of the lower electrode BE may be exposed by the secondary trimming process T2.

The outer wall surface 23S of the cylindrical electrode 23 may include the upper-level outer wall and the lower-level outer wall. The upper-level outer wall of the cylindrical electrode 23 may be lower than the upper-level protective layer pattern 22U and the upper-level supporter 18S. The height of the upper-level outer wall of the cylindrical electrode 23 may correspond to the distance between the upper-level supporter 18S and the etch stop layer 14. The lower-level outer wall of the cylindrical electrode 23 may be lower than the middle-level protective layer pattern 22M and the lower-level supporter 16S. The height of the lower-level outer wall of the cylindrical electrode 23 may correspond to the distance between the lower-level supporter 16S and the etch stop layer 14.

The middle-level protective layer pattern 22M may be vertically spaced apart from the upper-level protective layer pattern 22U. The lower-level protective layer pattern 22L may be vertically spaced apart from the middle-level protective layer pattern 22M. The upper-level protective layer pattern 22U may have a shape surrounding a portion of the upper outer wall of the cylindrical electrode 23. The middle-level protective layer pattern 22M may be positioned at a lower level than the upper-level protective layer pattern 22U while surrounding a portion of the middle outer wall of the cylindrical electrode 23. The lower-level protective layer pattern 22L may be positioned at a lower level than the middle-level protective layer pattern 22M, while having a shape surrounding the bottom surface of the cylindrical electrode 23 and the sidewalls of the lowermost portion which is continuous from the bottom surface of the cylindrical electrode 23. The distance between the upper-level protective layer pattern 22U and the middle-level protective layer pattern 22M may be shorter than the distance between the middle-level protective layer pattern 22M and the lower-level protective layer pattern 22L.

The lower-level protective layer pattern 22L may be electrically connected to the lower electrode BE and the contact plugs 13. The lower-level protective layer pattern 22L, the upper-level protective layer pattern 22U, and the middle-level protective layer pattern 22M may include amorphous titanium nitride or amorphous niobium.

The lower-level protective layer pattern 22L may include amorphous conductive niobium nitride. Amorphous conductive niobium nitride may be formed by combining amorphous niobium which is used as the protective layer 22 with nitrogen of titanium nitride which is used as the cylindrical electrode 23. The upper-level protective layer pattern 22U and the middle-level protective layer pattern 22M may also include amorphous conductive niobium nitride.

Since the bottom surface of the lower electrode BE is embedded in the lower-level protective layer pattern 22L, structural stability of the lower electrode BE may be increased from the subsequent process.

The second trimming process T2 may be performed while the supporter mask layer 25M remains. According to another embodiment of the present invention, the secondary trimming process T2 may be performed after the supporter mask layer 25M is removed.

By a series of the processes as described above, a multi-level supporter MLDS supporting the outer wall of the lower electrode BE and a multi-level protective structure MLCS may be formed. The multi-level supporter MLDS may include an upper-level supporter 18S and a lower-level supporter 16S, and the multi-level protective structure MLCS may include an upper-level protective layer pattern 22U, the middle-level protective layer pattern 22M, and the lower-level protective layer pattern 22L.

Subsequently, as illustrated in FIG. 2I, after the supporter mask layer 25M is removed, the dielectric layer 27 and the upper electrode 28 may be sequentially formed over the lower electrode BE.

Figure 4A:
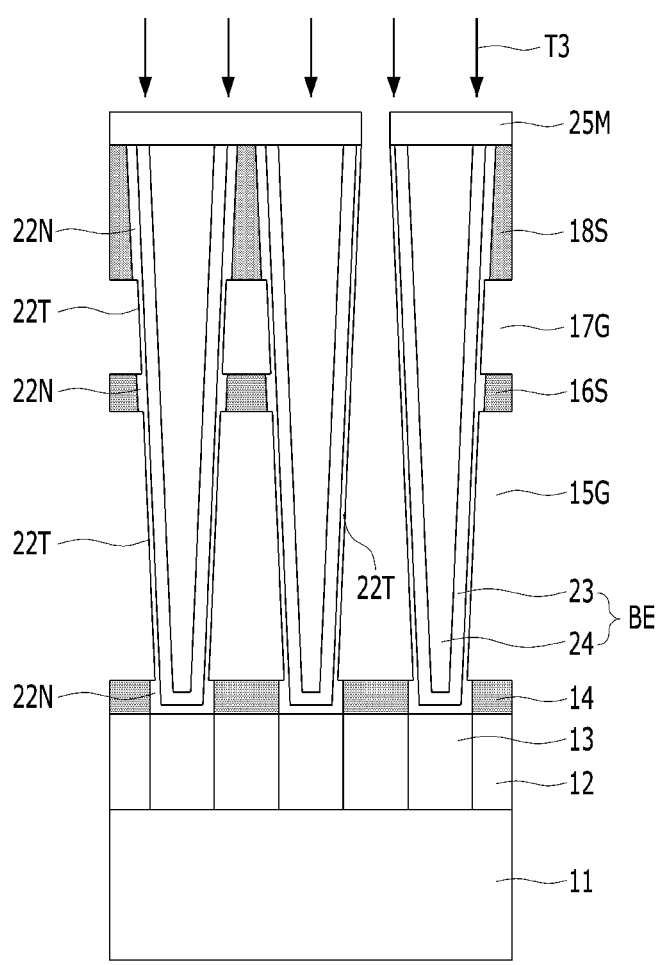
FIGS. 4A to 4C are cross-sectional views illustrating an example of a method for fabricating a semiconductor device in accordance with an embodiment of the present invention.
Figure 4B:
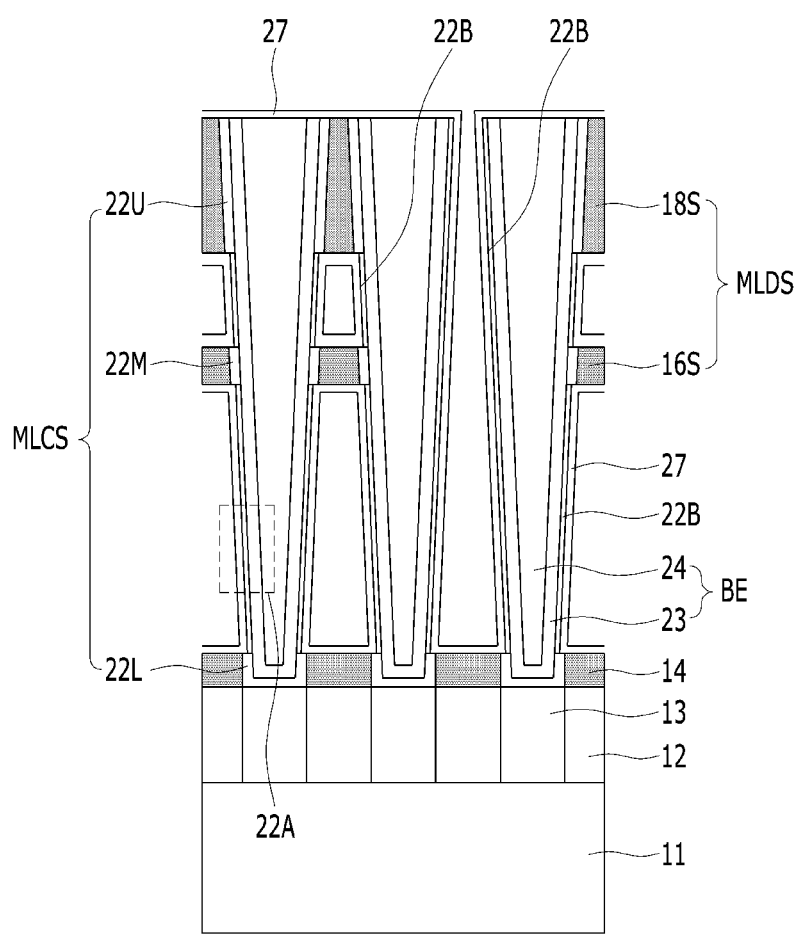
Figure 4C:
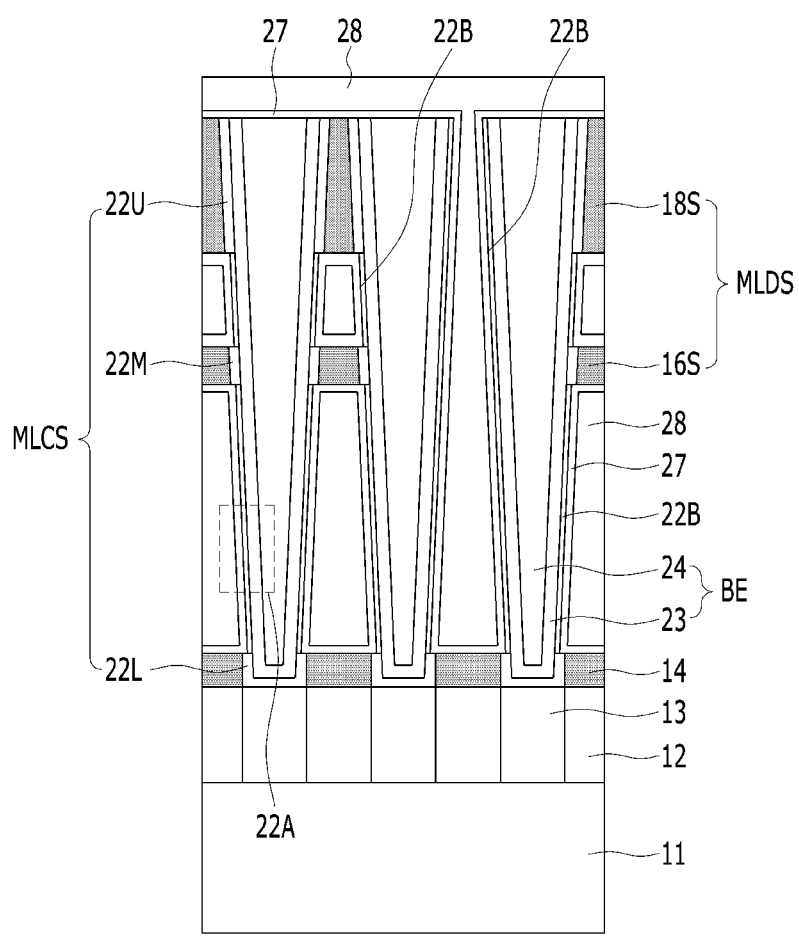

FIGS. 4A to 4C are cross-sectional views illustrating an example of a method for fabricating a semiconductor device in accordance with an embodiment of the present invention. FIGS. 4A to 4C may be similar to the fabrication method illustrated in FIGS. 2A to 2I. Also, FIGS. 4A to 4C may be similar to the fabrication method illustrated in FIGS. 3A to 3D. Hereinafter, a detailed description on the same constituent elements may be omitted.

An upper-level supporter 18S and a lower-level supporter 16S may be formed by the processes illustrated in FIGS. 2A to 2G. The second mold layer 17 may be removed from the space between the lower-level supporter 16S and the upper-level supporter 18S to form an upper-level air gap 17G. Also, the first mold layer 15 may be removed from the space between the lower-level supporter 16S and the etch stop layer 14 to form a lower-level air gap 15G. The upper-level outer wall of the protective layer 22 may be exposed by the upper-level air gap 17G. Also, the lower-level outer wall of the protective layer 22 may be exposed by the lower-level air gap 15G.

As described above, according to the embodiment of the present invention, after the first and second mold layers 15 and 17 are removed by a wet dip-out process, a trimming process T3 may be performed as illustrated in FIG. 4A. After the first and second mold layers 15 and 17 are removed, the protective layer 22 may include an exposed portion and a non-exposed portion. The exposed portion of the protective layer 22 may refer to the outer wall that is exposed as the first and second mold layers 15 and 17 are removed, and the non-exposed portion of the protective layer 22 may refer to a portion contacting the upper-level supporter 18S and the lower-level supporter 16S. Also, the non-exposed portion of the protective layer 22 may include a portion in contact with the etch stop layer 14.

The trimming process T3 may increase the spacing distance between the neighboring lower electrodes BE. The trimming process T3 may remove impurities such as metal groups remaining after the first and second mold layers 15 and 17 are removed. A portion of the protective layer 22 may be removed by the trimming process T3.

The trimming process T3 may include a partial etching process on the exposed portion of the protective layer 22. The trimming process T3 may include a wet etching process of the protective layer 22. The trimming process T3 may include a cleaning process, and the cleaning process may be performed by using a mixture of ammonium hydroxide ($NH_4OH$), hydrogen peroxide ($H_2O_2$), and water ($H_2O$). The trimming process T3 may be a process of partially etching portions of the protective layer 22 exposed by the upper-level air gap 17G and the lower-level air gap 15G. The trimming process T3 may include a process of thinning the portions of the protective layer 22 exposed by the upper-level air gap 17G and the lower-level air gap 15G. Since the protective layer 22 is first exposed to the trimming process T3, the surface roughness of the cylindrical electrode 23 of the lower electrode BE may not be deteriorated.

After the trimming process T3, non-trimmed protective layers 22N and partially trimmed protective layers 22T may be formed. The non-trimmed protective layers 22N may refer to a protective layer which is not exposed to the trimming process T3, and the partially trimmed protective layers 22T may refer to a portion whose thickness becomes thin by the trimming process T3. The partially trimmed protective layers 22T may be thinner than the non-trimmed protective layers 22N. The non-trimmed protective layers 22N and the partially trimmed protective layers 22T may be continuous to have a shape covering the cylindrical electrode 23 of the lower electrode BE. The partially trimmed protective layers 22T may be an exposed portion of the protective layer and may be referred to as thinned exposed portions. The non-trimmed protective layers 22N may be a non-exposed portion of the protective layer 22.

The trimming process T3 may be performed while the supporter mask layer 25M remains. According to another embodiment of the present invention, the trimming process T3 may be performed after the supporter mask layer 25M is removed.

By the trimming process T3, as the thin partially trimmed protective layers 22T are formed, the distance between the neighboring lower electrodes BE may be widened.

Referring to FIG. 4B, after the supporter mask layer 25M is removed, a dielectric layer 27 may be formed. The dielectric layer 27 may be formed over the partially trimmed protective layers 22T.

The partially trimmed protective layers 22T may be oxidized by their exposure to an oxygen atmosphere while the dielectric layer 27 is formed or before the dielectric layer 27 is formed. As a result, a booster layer 22B may be formed between the dielectric layer 27 and the lower electrode BE. The booster layer 22B may serve to amplify the dielectric constant of the dielectric layer 27.

The non-trimmed protective layers 22N may not be oxidized while the dielectric layer 27 is formed. Accordingly, an upper-level protective layer pattern 22U, a middle-level protective layer pattern 22M, and a lower-level protective layer pattern 22L may be formed.

A booster layer 22B may be positioned between the middle-level protective layer pattern 22M and the upper-level protective layer pattern 22U. A booster layer 22B may be positioned between the lower-level protective layer pattern 22L and the middle-level protective layer pattern 22M. The upper-level protective layer pattern 22U, the middle-level protective layer pattern 22M, the lower-level protective layer pattern 22L, and the booster layer 22B may be continuous.

Referring to FIG. 4C, the upper electrode 28 may be formed over the dielectric layer 27.

As described above, the semiconductor device in accordance with the embodiment of the present invention may include contact plugs 13 formed over a substrate 11, lower electrodes BE over the contact plugs 13, multi-level supporters 18S and 16S supporting an outer wall of the lower electrodes BE, upper-level and middle-level protective layer patterns 22U and 22M between the multi-level supporters 18S and 16S and the lower electrodes BE, and lower-level protective layer patterns 22L positioned between the lower electrodes BE and the contact plugs 13.

Figure 5:
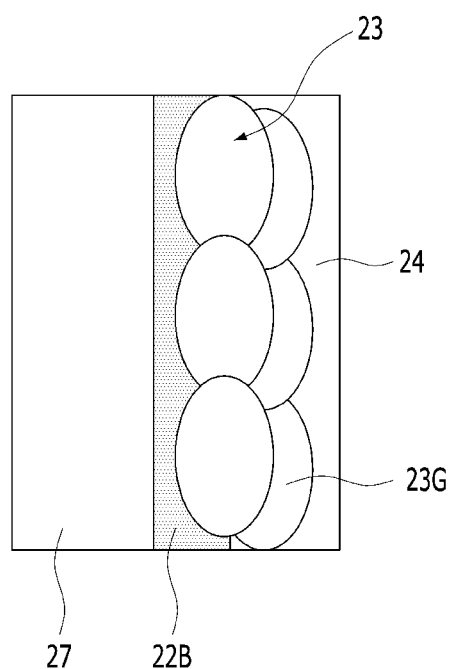
FIG. 5 is an enlarged view of a portion 22A shown in FIG. 4C.

FIG. 5 is an enlarged view of a portion 22A shown in FIG. 4C.

Referring to FIG. 5, a booster layer 22B may be positioned between the dielectric layer 27 and the cylindrical electrode 23. The booster layer 22B may be an oxide of the partially trimmed protective layer 22T. For example, when the partially trimmed protective layer 22T includes niobium, the booster layer 22B may include niobium oxide.

According to the embodiment of the present invention described above, since the protective layer 22 is first exposed during the trimming process T3, it is possible to prevent deterioration in the surface roughness which may be caused by the grain boundary of the grains 23G of the cylindrical electrode 23.

Also, it is possible to amplify the dielectric constant of the dielectric layer 27 by forming the booster layer 22B.

According to another embodiment of the present invention, even when a single supporter is applied, that is, even when only one supporter among the upper-level supporter 18S and the lower-level supporters 16S is applied, the surface roughness of the dielectric layer 27 may be improved by applying the protective layer 22.

According to another embodiment of the present invention, even when a supporter of at least three or more layers is applied, the surface roughness of the dielectric layer 27 may be improved by applying the protective layer 22.

According to the embodiment of the present invention, the surface roughness of a lower electrode may be improved by forming a protective layer on the outer wall of the lower electrode. This makes the thickness distribution of a dielectric layer uniform and suppresses the leakage current.

According to the embodiment of the present invention, structural stability of the lower electrode may be increased by forming a hybrid supporter including a supporter and a protective layer pattern.

According to the embodiment of the present invention, the capacitance of the capacitor may be further increased as the dielectric constant of the dielectric layer is amplified by a booster layer.

While the present invention has been described with respect to specific embodiments, it will be apparent to those skilled in the art that various changes and modifications may be made without departing from the spirit and scope of the invention as defined in the following claims.

What is claimed is:

1. A semiconductor device, comprising:
   a lower electrode over a semiconductor substrate;
   a supporter supporting an outer wall of the lower electrode;
   a niobium nitride layer between the supporter and the lower electrode;
   a lower-level niobium nitride layer positioned between the lower electrode and the semiconductor substrate, and vertically spaced apart from the niobium nitride layer;
   a dielectric layer over the lower electrode and the supporter;
   an upper electrode over the dielectric layer; and
   a niobium oxide layer between the dielectric layer and the lower electrode.

2. The semiconductor device of claim 1, wherein the niobium nitride layer and the lower-level niobium nitride layer include an amorphous conductive material, and the lower electrode includes a polycrystalline conductive material.

3. The semiconductor device of claim 1, wherein the lower electrode includes a polycrystalline titanium nitride.

4. The semiconductor device of claim 1, wherein niobium nitride layer and the lower-level niobium nitride layer include an amorphous niobium nitride, and the lower electrode includes a polycrystalline titanium nitride.

5. The semiconductor device of claim 1, wherein the supporter includes a multi-level supporter, and the niobium nitride layer includes a multi-level niobium nitride layer positioned between the multi-level supporter and the lower electrode.

6. The semiconductor device of claim 1, wherein the lower-level niobium nitride layer has a shape surrounding a bottom portion of the lower electrode.

7. The semiconductor device of claim 1, wherein the niobium oxide layer extends vertically to interconnect the niobium nitride layer and the lower-level niobium nitride layer to each other.

8. The semiconductor device of claim 1, wherein the lower electrode includes a polycrystalline cylindrical electrode that contacts the niobium nitride layer and a pillar-shaped electrode that fills an inside of the polycrystalline cylindrical electrode.

9. The semiconductor device of claim 1, wherein the dielectric layer includes ZAZ ($ZrO_2/Al_2O_3/ZrO_2$) stack, $TiO_2/ZrO_2/Al_2O_3/ZrO_2$ stack, $TiO_2/HfO_2/Al_2O_3/HfO_2$ stack, $Ta_2O_5/ZrO_2/Al_2O_3/ZrO_2$ stack, or $Ta_2O_5/HfO_2/Al_2O_3/HfO_2$ stack.

* * * * *